(12) United States Patent
Lin et al.

(10) Patent No.: US 11,562,998 B2
(45) Date of Patent: Jan. 24, 2023

(54) CAPACITOR AND METHOD FOR FORMING THE SAME

(71) Applicant: TAIWAN SEMICONDUCTOR MANUFACTURING COMPANY, LTD., Hsinchu (TW)

(72) Inventors: Meng-Han Lin, Hsinchu (TW); Meng-Sheng Chang, Hsinchu County (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 1 day.

(21) Appl. No.: 17/225,722

(22) Filed: Apr. 8, 2021

(65) Prior Publication Data
US 2022/0328470 A1 Oct. 13, 2022

(51) Int. Cl.
*H01L 21/02* (2006.01)
*H01L 27/02* (2006.01)
*H01L 21/82* (2006.01)

(52) U.S. Cl.
CPC .......... *H01L 27/0288* (2013.01); *H01L 21/82* (2013.01); *H01L 27/0218* (2013.01)

(58) Field of Classification Search
CPC .. H01L 27/0288; H01L 21/82; H01L 27/0218
See application file for complete search history.

(56) References Cited

U.S. PATENT DOCUMENTS

| | | | |
|---|---|---|---|
| 2004/0070034 A1* | 4/2004 | Park ..................... | H01L 28/20 257/E21.004 |
| 2006/0102980 A1* | 5/2006 | Nakashiba ...... | H01L 21/823878 257/508 |
| 2009/0121322 A1* | 5/2009 | Ozawa ............... | H01L 23/3171 438/622 |
| 2011/0073957 A1* | 3/2011 | Chiu .................... | H01L 28/24 257/536 |
| 2012/0217586 A1* | 8/2012 | Chern ................. | H01L 29/4966 257/E21.616 |
| 2014/0239363 A1* | 8/2014 | Pan ..................... | H01L 23/485 257/306 |
| 2018/0175023 A1* | 6/2018 | Visokay ............... | H01L 23/522 |

* cited by examiner

*Primary Examiner* — Samuel Park
(74) *Attorney, Agent, or Firm* — Maschoff Brennan

(57) ABSTRACT

An integrated circuit (IC) structure includes a semiconductor substrate, a shallow trench isolation (STI) region, and a capacitor. The STI region is embedded in the semiconductor substrate. The capacitor includes first and second conductive stacks. The first conductive stack includes a first dummy gate strip disposed entirely within the STI region and a plurality of first metal dummy gate contacts landing on the first metal capacitor strip. The second conductive stack includes a second dummy gate strip disposed entirely within the STI region and extending in parallel with the first dummy gate strip, and a plurality of second dummy gate contacts landing on the second dummy gate strip, wherein the first conductive stack is electrically isolated from the second conductive stack.

20 Claims, 39 Drawing Sheets

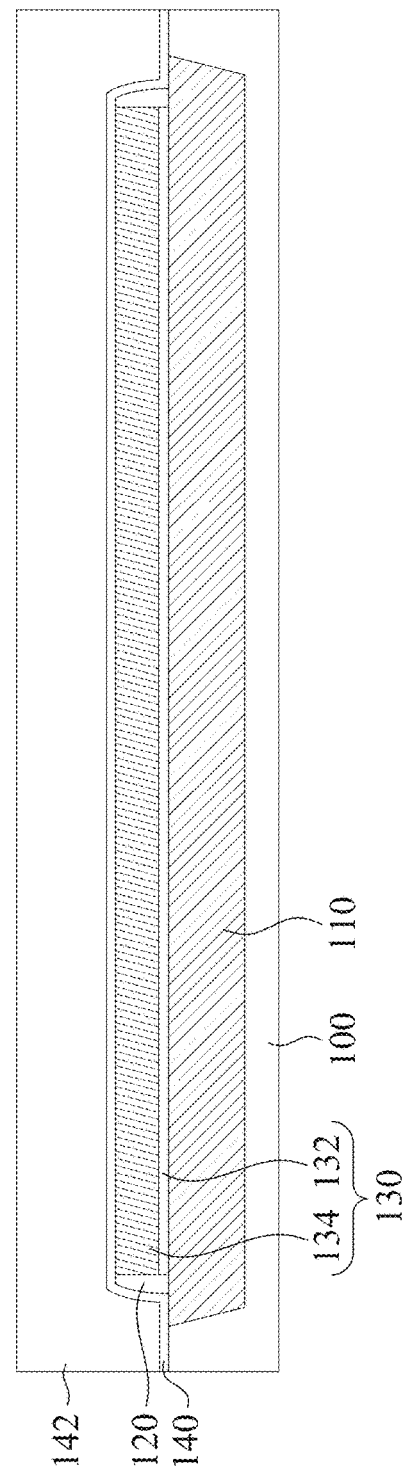

CAPACITOR AND METHOD FOR FORMING THE SAME

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
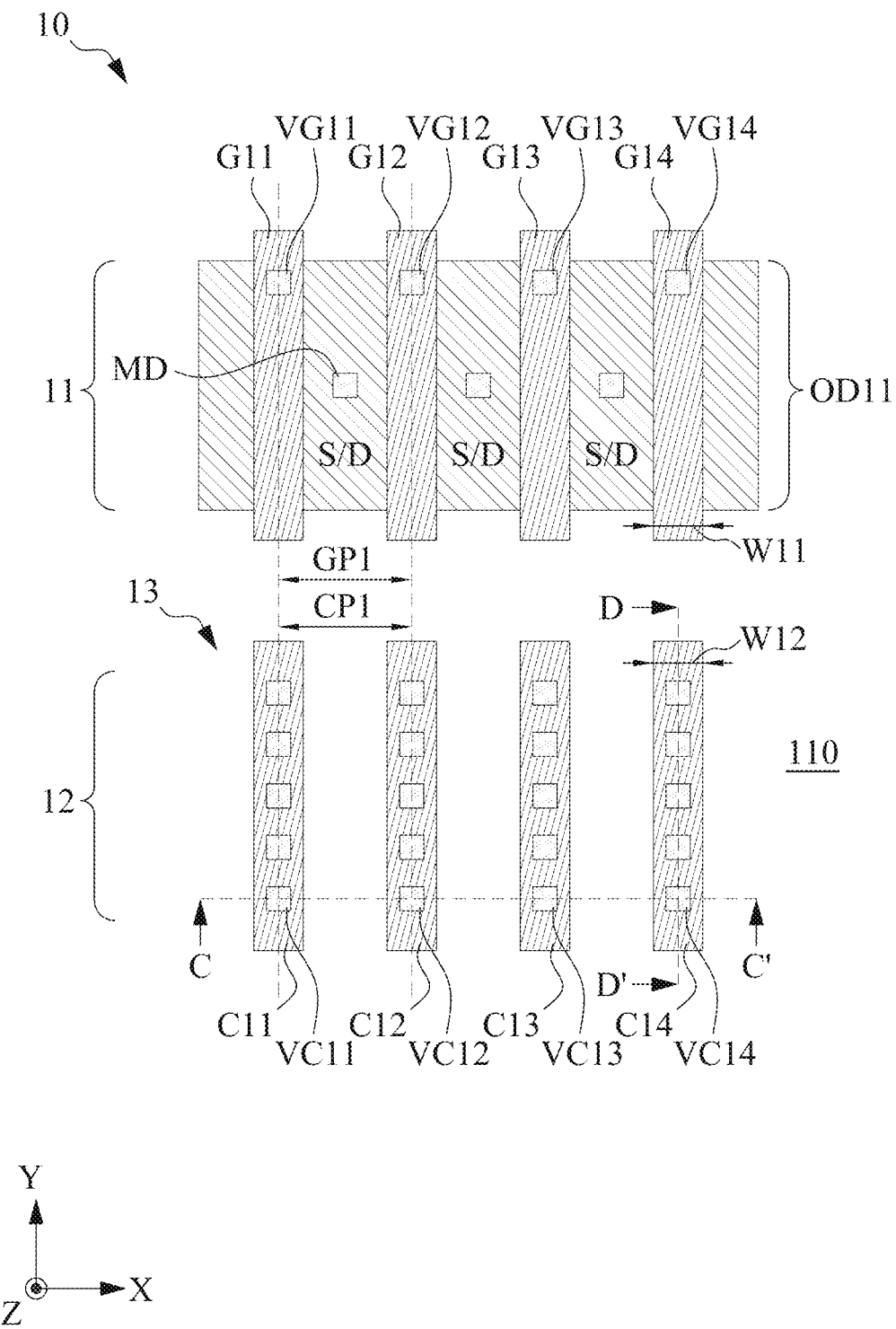
FIGS. 1A to 1D are schematic views of an integrated circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Capacitors are widely used in integrated circuits, such as finger metal-oxide-metal (FMOM) capacitors, which includes metal electrodes separated by an insulation layer. The capacitance of a capacitor is proportional to its area and the dielectric constant (k) of the insulation layer, and is inversely proportional to the thickness of the insulation layer. Therefore, to increase the capacitance, it may increase the area and k value and reduce the thickness of the insulation layer. However, the thickness and k value are often constrained by the technology used for forming the capacitor. On the other hand, since the capacitors are often formed in low-k inter-metal dielectric (IMD) layers for reducing RC delay in integrated circuits, the k value is also constrained.

The present disclosure in various embodiments provides dummy gate structures (i.e., gate structures not functioned to create channels in underlying regions of semiconductor substrate) and dummy gate contacts to serve as capacitors. Therefore, the dummy gate structures and the dummy gate contacts may also be interchangeably referred to as capacitor structures and capacitor contacts in this context. These dummy gate structures and dummy gate contacts can be fabricated simultaneously with functional gate structures (i.e., gate structures functioned to create channels in underlying regions of semiconductor substrate) and metal in a same gate replacement process and functional gate contacts, and thus fabrication of the capacitors will not result in additional processes and hence additional cost. In this way, a capacitance of the capacitor can be tuned by designing dummy metal gate layout patterns, dummy gate via layout patterns, metal line patterns, and/or metal via patterns.

Figure 1B:
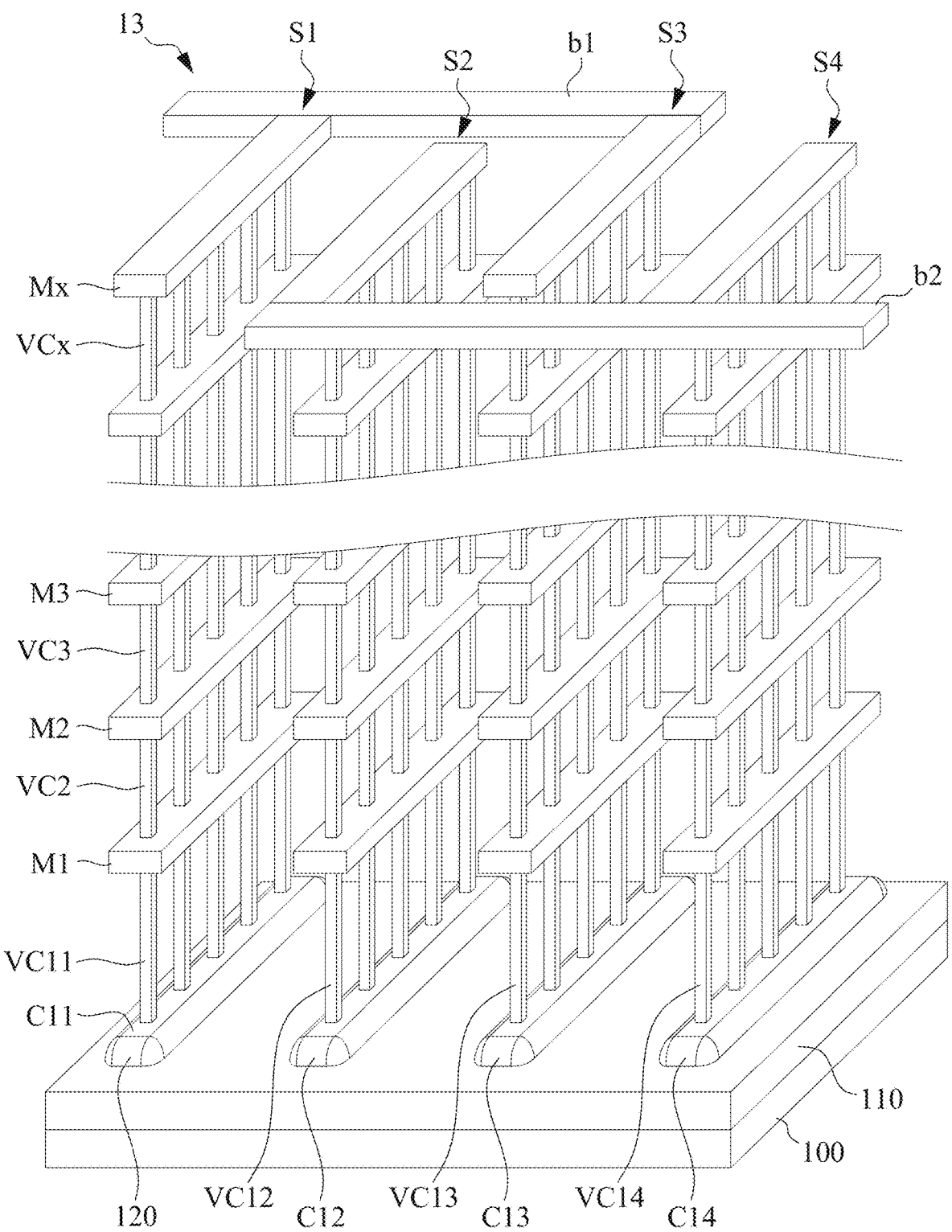
Figure 1C:
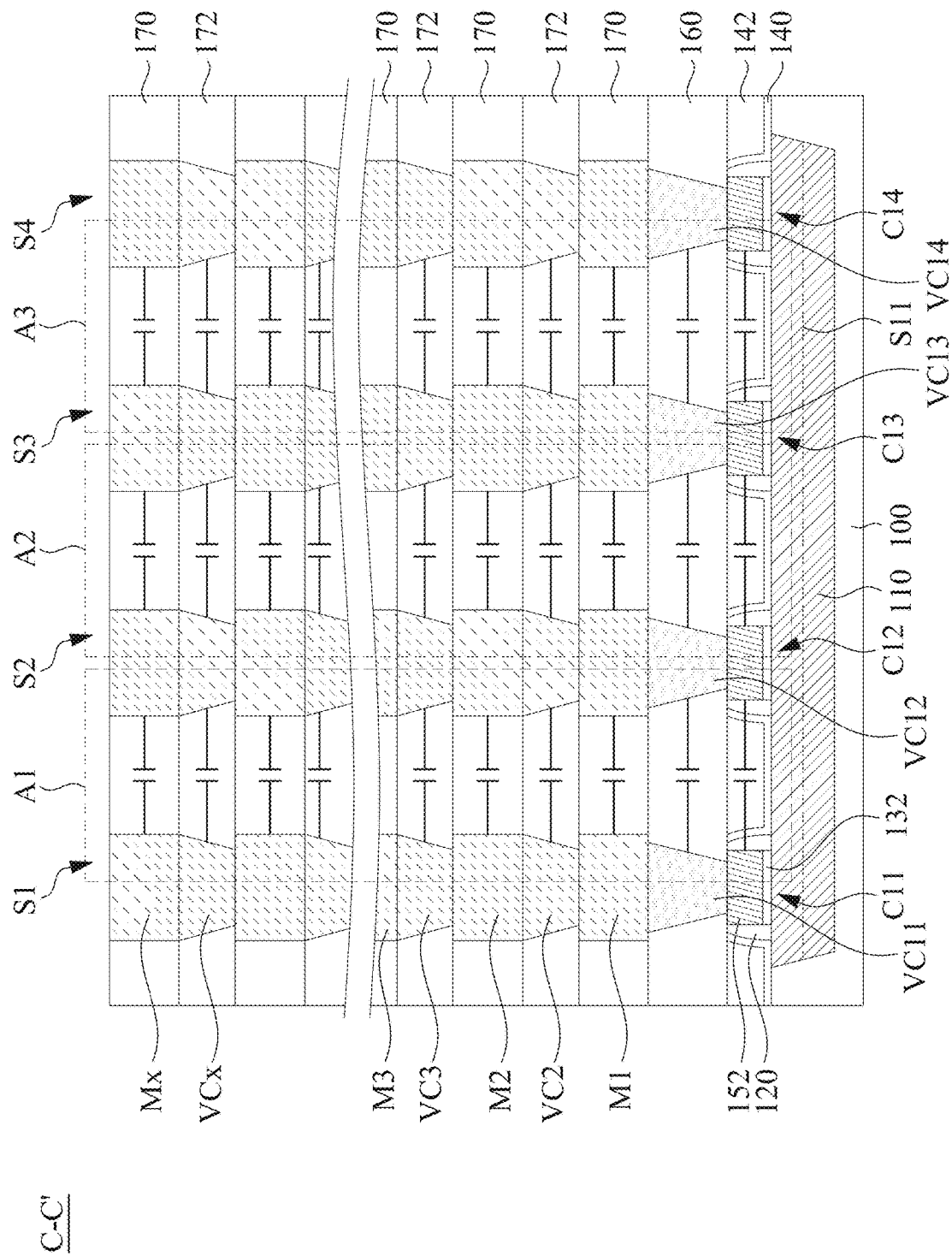
Figure 1D:
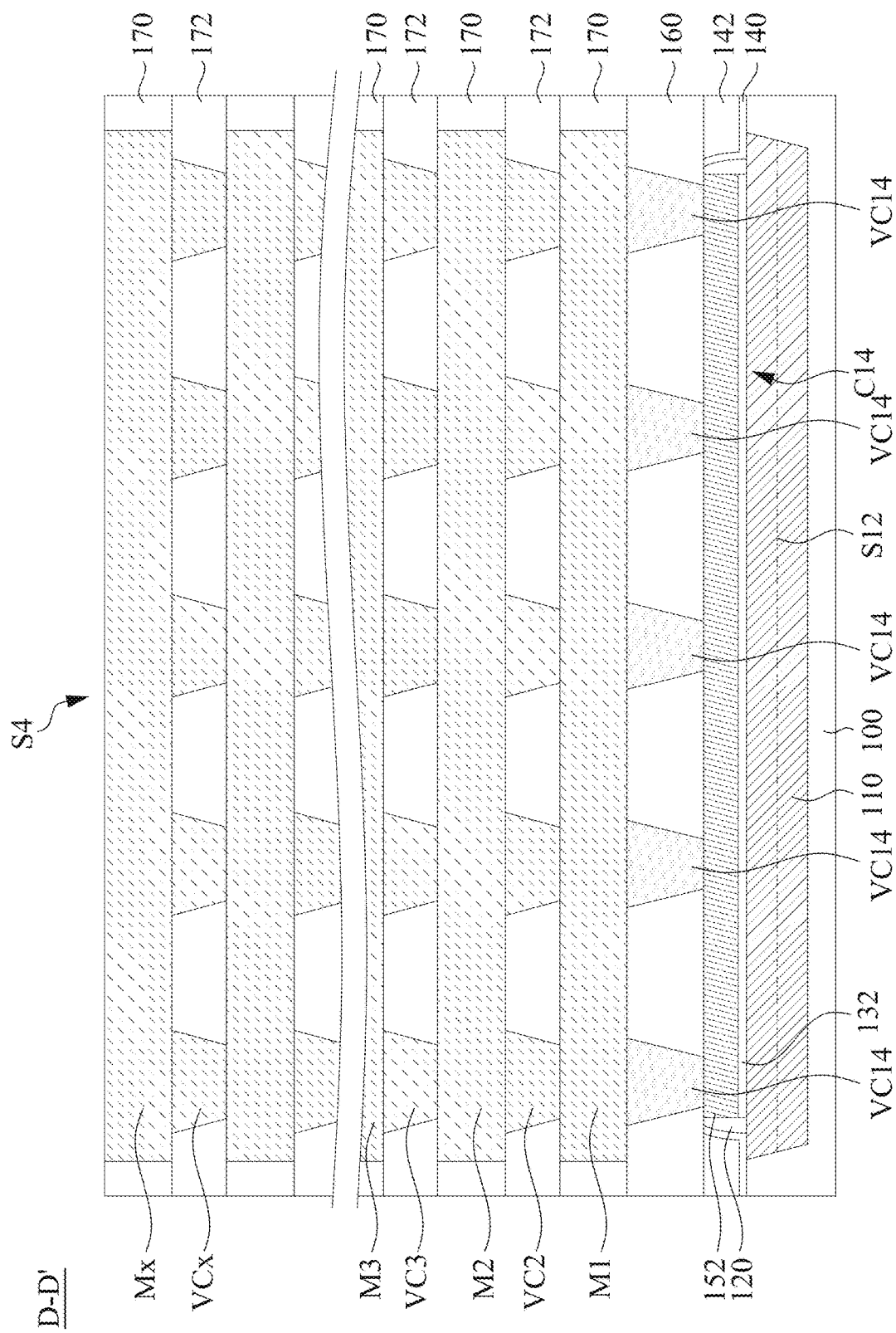

FIGS. 1A-1D illustrate a capacitor 13 of a FMOM capacitor including all dummy gate structures and dummy gate contacts overlapping a passive region (also called capacitor region in this context). In greater detail, FIG. 1A illustrates a top view of an exemplary integrated circuit 10 having a transistor region 11 and a capacitor region 12 having the capacitor 13 in accordance with some embodiments of the present disclosure. FIG. 1B illustrates a perspective view of the capacitor region 12 in accordance with some embodiments. FIG. 1C illustrates a cross-sectional view of the integrated circuit 10 in accordance with some embodiments obtained from the vertical plane containing line C-C' in FIG. 1A. FIG. 1D illustrates a cross-sectional view of the integrated circuit 10 in accordance with some embodiments obtained from the vertical plane containing line D-D' in FIG.

1A. It is noted that some elements in FIGS. 1B to 1D are not illustrated in FIG. 1A for brevity. The integrated circuit 10 is a non-limiting example for facilitating the illustration of the present disclosure.

Reference is made to FIGS. 1A-1D. The integrated circuit 10 includes a substrate 100. The substrate 100 may be made of a suitable elemental semiconductor, such as silicon, diamond or germanium; a suitable alloy or compound semiconductor, such as Group-IV compound semiconductors (silicon germanium (SiGe), silicon carbide (SiC), silicon germanium carbide (SiGeC), GeSn, SiSn, SiGeSn), Group III-V compound semiconductors (e.g., gallium arsenide, indium gallium arsenide InGaAs, indium arsenide, indium phosphide, indium antimonide, gallium arsenic phosphide, or gallium indium phosphide), or the like. Further, the substrate 100 may include an epitaxial layer (epi-layer), which may be strained for performance enhancement, and/or may include a silicon-on-insulator (SOI) structure.

As shown in FIG. 1A, the substrate 100 includes an active region OD11 extending along the X-direction within the transistor region 11. In some embodiments, the X-direction is a horizontal direction of the top view of the integrated circuit 10. In some embodiments, the X-direction is a direction other than horizontal direction. The transistor region 11 may include a variety of active devices, such as P-channel field effect transistors (PFETs), N-channel field effect transistors (NFETs), metal-oxide semiconductor field effect transistors (MOSFETs), complementary metal-oxide semiconductor transistors (CMOSs), bipolar transistors, high voltage transistors, high frequency transistors, and/or combinations thereof formed on the active region OD11.

In FIG. 1A, the integrated circuit 10 further includes one or more isolation regions, such as a shallow trench isolation (STI) region 110 formed in the semiconductor substrate 100 to define and electrically isolate the active region OD11. Formation of the STI region 110 includes patterning the semiconductor substrate 100 to form one or more trenches in the substrate 100 by using suitable photolithography and etching techniques, depositing one or more dielectric materials (e.g., silicon oxide) to completely fill the trenches in the substrate 100, followed by a planarization process (e.g., chemical mechanical polish (CMP) process) to level the STI region 110 with the active region OD11. The dielectric materials of the STI region 110 may be deposited using a high density plasma chemical vapor deposition (HDP-CVD), a low-pressure CVD (LPCVD), sub-atmospheric CVD (SACVD), a flowable CVD (FCVD), spin-on coating, and/or the like, or a combination thereof. After the deposition, an anneal process or a curing process may be performed, especially when the STI region 110 is formed using flowable CVD. Although the cross-sections of the STI region 110 illustrated in FIGS. 1B-1C have vertical sidewalls, they may have tapered sidewalls due to nature of etching processes.

In FIG. 1A, the substrate 100 includes the capacitor region 12 within the STI region 110. The capacitor region 12 may include a variety of passive devices in various embodiments, such as capacitors and other passive devices such as resistors, inductors, fuses, or other suitable passive devices formed on the STI region 110. In certain embodiments of the present disclosure, the integrated circuit 10 includes metal gate transistors formed over the active region OD11 and capacitors formed over the capacitor region 12.

In the depicted embodiment, the STI region 110 has a top surface substantially level with a top surface of the active region OD11. In some embodiments, the STI region 110 is further recessed (e.g., by an etch back process) to fall below the top surfaces of the active region OD11, such that the active region OD11 protrudes above the top surface of the recessed STI region 110 (as indicated by the dash lines S11 in FIG. 1C and dash lines S12 in FIG. 1D to form fin-like structures, which in turn allows for forming fin-type field effect transistors (FinFETs) over the active region OD11.

Reference is made to FIGS. 1A-1D. The integrated circuit 10 includes the capacitor 13 formed over the STI region 110 within the capacitor region 12. The capacitor 13 includes dummy gate structures C11-C14 and dummy gate contacts VC11-VC14. Other embodiments may contain more or fewer dummy gate structures and/or a corresponding more or fewer number of dummy gate contacts. As illustrated in FIGS. 1A and 1B, the dummy gate structures C11, C12, C13, and C14 extend within the capacitor region 12 on the STI region 110 along the Y-direction. In some embodiments, the dummy gate structures C11, C12, C13, and C14 are disposed entirely within the STI region. The dummy gate structures C11, C12, C13, and C14 have a strip shape from top view and may also be thus interchangeably referred to as dummy gate strips in this context.

In FIGS. 1A and 1B, the plurality of dummy gate contacts VC11 connect the dummy gate structure C11 to a first metal line M1 above thereof and are arranged in a lengthwise direction of the dummy gate structure C11. The plurality of dummy gate contacts VC12 connect the dummy gate structure C12 to a second metal line M1 above thereof and are arranged in a lengthwise direction of the dummy gate structure C12. The plurality of dummy gate contacts VC13 connect the dummy gate structure C13 to a third metal line M1 above thereof and are arranged in a lengthwise direction of the dummy gate structure C13. The plurality of dummy gate contacts VC14 connect the dummy gate structure C14 to a fourth metal line M1 above thereof and are arranged in a lengthwise direction of the dummy gate structure C14. By way of example and not limitation, the dummy gate contacts VC11, VC12, VC13, and VC14 are square patterns with a fixed size depending on the process. The dummy gate contacts VC11, VC12, VC13, and VC14 are aligned with each other across multiple dummy gate structures C11, C12, C13, and C14 from the top-view shown in FIG. 1A. In some embodiments, the dummy gate contacts VC11, VC12, VC13, and VC14 may be staggered across the multiple dummy gate structures C11, C12, C13, and C14 from the top-view.

Also included in the capacitor 13 is a plurality of interlayer dielectric (ILD) layers, identified as 142 and 160 are depicted in FIGS. 1C and 1D. The dummy gate structures C11, C12, C13, and C14 and dummy gate contacts VC11, VC12, VC13, and VC14 are formed in the ILD layers 142 and 160. In some embodiments, the ILD layers 142 and 160 may be made of silicon oxide, silicon nitride, silicon oxynitride, tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

Reference is made to FIGS. 1A-1D, the capacitor 13 further includes a plurality of metal lines, labeled as M1 through Mx, with a plurality of metal vias or interconnects, labeled as VC2 through VCx, wherein the metal lines Mx are in the topmost metal layer of the capacitor 13 as shown in FIGS. 1B-1D and x is an integer. Throughout the description, the term "metal layer" refers to the collection of the metal lines in the same layer. In FIG. 1B, the metal lines M1 through Mx extend along lengthwise directions of the dummy gate structures C11, C12, C13, and C14 therebelow. The metal lines M1 through Mx have a strip shape from top view and can thus be interchangeably referred to as finger electrodes. By way of example and not limitation, the metal vias VC2 through VCx are square patterns with a fixed size depending on the process. The metal vias VC2 through VCx are aligned with each other across multiple dummy gate structures C11, C12, C13, and C14 as shown in FIG. 1B. In some embodiments, the metal vias VC2 through VCx may be staggered across the multiple dummy gate structures C11, C12, C13, and C14.

In some embodiments, the metal lines M1 through Mx and/or the metal vias VC2 through VCx may be formed of copper (Cu), aluminum (Al), titanium (Ti), titanium nitride (TiN), tantalum (Ta), tantalum nitride (TaN), tantalum carbide (TaC), tantalum silicon nitride (TaSiN), tungsten (W), tungsten nitride (WN), molybdenum nitride (MoN), the like and/or combinations thereof.

Also included in the capacitor 13 is a plurality of interlayer dielectric (ILD) layers, identified as 170 and 172 are depicted in FIGS. 1C and 1D as spanning the dummy gate structures C11, C12, C13, and C14 and the dummy gate contacts VC11, VC12, VC13, and VC14. The metal lines M1 through Mx and the metal vias VC2 through VCx are formed in the ILD layers 170 and 172. In some embodiments, the ILD layers 170 and 172 may be made of silicon oxide, silicon nitride, silicon oxynitride, tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

Reference is made to FIG. 1B, the capacitor 13 includes a plurality of conductive stacks S1-S4, including a portion of each of metal lines M1-Mx connected by metal vias VC2-VCx, with the metal layer M1 connecting the conducive stacks to the dummy gate contacts VC11, VC12, VC13, and VC14 above the dummy gate structures C11, C12, C13, and C14. In greater detail, the dummy gate structure C11, the dummy gate contacts VC11, the capacitor vias VC2, VC3 . . . VCx vertically above the dummy gate contacts VC11, and the metal lines M1, M2, M3 . . . Mx vertically above the dummy gate contacts VC11 are electrically connected to form a first conductive stack S1 disposed over the STI region 110. The dummy gate structure C12, the capacitor vias VC2, VC3 . . . VCx vertically above the dummy gate contacts VC12, and the metal lines M1, M2, M3 . . . Mx vertically above the dummy gate contacts VC12 are electrically connected to form a second conductive stack S2 over the STI region 110. The dummy gate structure C13, the capacitor vias VC, VC3 . . . VCx vertically above the dummy gate contacts VC13, and the metal lines M1, M2, M3 . . . Mx vertically above the dummy gate contacts VC13 are electrically connected to form a third conductive stack S3 over the STI region 110. The dummy gate structure C14, the dummy gate contacts VC14, the capacitor vias VC2, VC3 . . . VCx vertically above the dummy gate contacts VC14, and the metal lines M1, M2, M3 . . . Mx vertically above the dummy gate contacts VC14 are electrically connected to form a fourth conductive stack S4 over the STI region 110.

These conductive stacks S1-S4 are arranged in parallel over the STI region 110 and separated from each other by a dielectric medium (e.g., including STI region 110 and/or ILD layers), which in turn allows for capacitance existing in any adjacent two of the conductive stacks S1-S4. In greater detail, the conductive stacks S1 and S2 that are arranged in parallel and electrically isolated from each other forms a capacitor A1, especially like a parallel-plate capacitor. Similarly, the conductive stacks S2 and S3 that are arranged in parallel and electrically isolated from each other forms a capacitor A2, and the conductive stacks S3 and S4 that are arranged in parallel and electrically isolated from each other forms a capacitor A3. In each capacitor, the capacitance includes at least the dummy gate-to-dummy gate capacitance (e.g., metal gate-to-metal gate capacitance, if the dummy gates are formed of metals), metal line-to-metal line capacitance, via-to-via capacitance, and contact-to-contact capacitance. Therefore, capacitance resulting from the parallel conducive stacks S1-S4 can be increased.

As illustrated in FIG. 1C, in the capacitance A1, the dummy gate-to-dummy gate capacitance is formed by the dummy gate structures C11 and C12, the contact-to-contact capacitance is formed by the dummy gate contacts VC11 and VC12, the metal line-to-metal line capacitances are formed by any adjacent two of the metal lines M1 through Mx on the same level height in the first and second conductive stacks S1 and S2, the via-to-via capacitances are formed by any adjacent two of the metal vias VC2 through VCx on the same level height in the first and second conductive stacks S1 and S2.

Similarly, in the capacitance A2, the dummy gate-to-dummy gate capacitance is formed by the dummy gate structures C12 and C13, the contact-to-contact capacitance is formed by the dummy gate contacts VC12 and VC13, the metal line-to-metal line capacitances are formed by any adjacent two of the metal lines M1 through Mx on the same level height in the second and third conductive stacks S2 and S3, the via-to-via capacitances are formed by any adjacent two of the metal vias VC2 through VCx on the same level height in the second and third conductive stacks S2 and S3. Similarly, in the capacitance A3, the dummy gate-to-dummy gate capacitance is formed by the dummy gate structures C13 and C14, the contact-to-contact capacitance is formed by the dummy gate contacts VC13 and VC14, the metal line-to-metal line capacitances are formed by any adjacent two of the metal lines M1 through Mx on the same level height in the third and fourth conductive stacks S3 and S4, the via-to-via capacitances are formed by any adjacent two of the metal vias VC2 through VCx on the same level height in the third and fourth conductive stacks S3 and S4. Therefore, capacitance resulting from the dummy gate structures C11-C14, the dummy gate contacts VC11-VC14, the metal lines M1 through Mx, and the metal vias VC2 through VCx in the parallel conducive stacks S1-S4 can be increased, and thus the electrical performance of the integrated circuit (IC) circuit 10 can be improved.

Reference is made to FIG. 1B, the first and third conducive stacks S1 and S3 of the capacitor 13 are electrically connected to each other by the topmost metal lines Mx thereof through a first bus b1 and spaced apart from the second and fourth conducive stacks S2 and S4 of the capacitor 13. The second and fourth conducive stacks S2 and S4 of the capacitor 13 are electrically connected to each other by the topmost metal lines Mx thereof through a second bus b2 different than the first bus b1. The first and third conducive stacks S1 and S3 of the capacitor 13 are electrically isolated from the second and fourth conducive stacks S2 and S4 of the capacitor 13.

Reference is made to FIG. 1A, the integrated circuit 10 further includes metal gate structures G11, G12, G13, and G14 extending within the active region OD11 and across the active region OD11 along the Y-direction perpendicular to the X-direction. The metal gate structures G11-G14 have a strip shape from top view and are thus interchangeably referred to as metal gate strips in this context. In some embodiments as illustrated in FIG. 1A, the metal gate structures G11-G14 are arranged in a first row along the X-direction, and the dummy gate structures C11-C14 are arranged in a second row along the X-direction. The dummy gate structures C11-C14 and metal gate structures G11-G14 are on same level height. The dummy gate structures C11-C14 are formed simultaneously with the metal gate structures G11-G14, and thus the dummy gate structures C11-C14 can be formed without using additional processes and hence additional cost. At the time the metal gate structures G11-G14 are formed, the dummy gate structures C11-C14 of the capacitor 13, which includes a dielectric layer 132 and one or more metal layers 152, are also formed simultaneously. Moreover, because of simultaneous formation of the capacitors and metal gates, the dummy gate structures C11-C14 are formed of same material(s) as the metal gate structures G11-G14, without additional metal materials and masks. The advantageous features of the present disclosure include forming capacitor with increased capacitance and improved electrical performance without increasing the manufacturing cost.

As a result, the metal gate structures G11, G12, G13, and G14 in the active region OD11 form functional transistors (i.e., transistors functioned to create channels in the active region OD11), while the dummy gate structures C11-C14 on the STI region 110 form non-functional or dummy transistors (i.e., transistor-like structures not functioned to create channels in the passive region).

In some embodiments, the metal gate structures G11-G14 are functional high-k metal gate (HKMG) gate structures functioned to create channels in the active region OD11, and the dummy gate structures C11-C14 are dummy HKMG gate structure not functioned to create channels on the STI region 110, which is beneficial for increasing the capacitance of the capacitor 13. Both the functional HKMG gate structures G11-G14 and the dummy HKMG structures C11-C14 are formed using a same gate-last process flow (interchangeably referred to as gate replacement flow), which will be explained in greater detail below. As a result of the gate-last process flow, each of the metal gate structures G11-G14 and the dummy gate structures C11-C14 includes the one or more metal layers 152 and the dielectric layer 132 lining a bottom surface of the one or more metal layers 152 as illustrated in FIG. 1C.

In some embodiments, the dielectric layer 132 includes a stack of an interfacial dielectric material and a high-k dielectric material. In some embodiments, the dielectric layer 132 may line sidewalls of the one or more metal layers 152, so that the dielectric layer 132 has a U-shaped cross section. In some embodiments, the interfacial dielectric material includes silicon dioxide. Exemplary high-k gate dielectric materials include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$-$Al_2O_3$) alloy, other suitable high-k dielectric materials, and/or combinations thereof. The gate metal(s) is formed over the gate dielectric. Exemplary metal(s) 152 is a single layer structure or a multi-layer structure including, for example, copper (Cu), aluminum (Al), titanium (Ti), titanium nitride (TiN), tantalum (Ta), tantalum nitride (TaN), tantalum carbide (TaC), tantalum silicon nitride (TaSiN), tungsten (W), tungsten nitride (WN), molybdenum nitride (MoN), the like and/or combinations thereof.

In the depicted embodiment as illustrated in FIG. 1A, the metal gate structures G11-G14 are equidistantly arranged along the X-direction at a gate pitch GP1 (i.e., center-to-center spacing between neighboring gate structures), and the dummy gate structures C11-C14 are equidistantly arranged along the X-direction at a gate pitch CP1 (i.e., center-to-center spacing between neighboring dummy gate structures). In some embodiments, the gate pitch CP1 is substantially equal to the gate pitch GP1 for reducing pattern loading effect during fabricating the metal gate structures G11-G14 and dummy gate structures C11-C14 (e.g. loading effect (e.g., dishing) occurring in a CMP process used to remove excessive gate metal materials). The dummy gate-to-dummy gate capacitance formed by the dummy gate structures C11-C14 may be in correlation with the gate pitch CP1 of the dummy gate structures C11-C14, and thus the gate pitch CP1 can be selected depending on a desired capacitance of the capacitor 13. In some other embodiments where the integrated circuit has more relaxed requirements about the loading effect in fabrication of the metal gate structures G11-G14 and dummy gate structures C11-C14, the gate pitch CP1 may be greater or less than the gate pitch GP1.

In the depicted embodiment as illustrated in FIG. 1A, the metal gate structures G11-G14 each have a gate width W11 measured in the X-direction, and the dummy gate structures C11-C14 each have a capacitor width W12 measured in the X-direction and substantially equal to the gate width W11. Same width of metal gates and capacitors also aids in preventing pattern loading effect during their fabrication processes. The dummy gate-to-dummy gate capacitance formed by the dummy gate structures C11-C14 may be in correlation with the gate width W11 of the dummy gate structures C11-C14, and thus the gate width W11 can be selected depending on a desired capacitance of the capacitor 13. In some other embodiments where the integrated circuit has more relaxed concern about the loading effect in fabrication of the metal gate structures G11-G14 and dummy gate structures C11-C14, the capacitor width W12 may be greater than the gate width W11.

In the depicted embodiment as illustrated in FIG. 1A, the dummy gate structures C11-C14 are respectively aligned with the metal gate structures G11-G14 in the Y-direction. In this configuration, the dummy gate structures C11-C14 and the corresponding metal gate structures G11-G14 can be formed by using a gate cut process. By way of example and not limitation, fabrication of the dummy gate structure C11 and the metal gate structure G11 may include forming as a single continuous HKMG strip extending along the Y-direction from top view, followed by etching the single continuous HKMG strip to break it into separate strips that respectively serve as the dummy gate structure C11 and the metal gate structure G11. Although FIG. 1A illustrates an alignment arrangement, in some other embodiments the dummy gate structures C11-C14 can be misaligned with each of the metal gate structures G11-G14 in the Y-direction.

In the depicted embodiment as illustrated in FIG. 1A, the integrated circuit 10 further includes a plurality of source/drain regions S/D in the active region OD11, but includes no source/drain region within the capacitor region 12. The source/drain regions S/D are doped semiconductor regions located on opposite sides of the corresponding metal gate structures G11-G14. In some embodiments, the source/drain regions S/D include p-type dopants or impurities such as boron for forming functional p-type FETs in the active region OD11. In some embodiments, the source/drain regions S/D include n-type dopants or impurities such as phosphorus for forming functional n-type FETs in the active region OD11.

In some embodiments, the source/drain regions S/D may be epitaxially grown regions. For example, gate spacers (not shown) may be formed alongside sacrificial gate structures (which will be replaced with the metal gate structures G11-G14 and the dummy gate structures C11-C14) by depositing a spacer material and anisotropically etching the spacer material, and subsequently, the source/drain regions S/D may be formed self-aligned to the spacers 120 by first etching the active region OD11 to form recesses, and then depositing a crystalline semiconductor material in the recesses by a selective epitaxial growth (SEG) process that may fill the recesses in the active region OD11 and may extend further beyond the original surface of the active region OD11 to form raised source/drain epitaxy structures in some embodiments. The crystalline semiconductor material may be an elemental semiconductor (e.g., Si, or Ge, or the like), or an alloy semiconductor (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of n-type or p-type dopants may be introduced into source/drain regions S/D either in situ during SEG, or by an ion implantation process performed after the SEG, or by a combination thereof. In FIG. 1A, the integrated circuit 10 further includes a plurality of source/drain contacts MD landing on the respective source/drain regions S/D within the active region OD11. In some embodiments, the source/drain contacts MD includes suitable one or more metals, such as W, Cu, Cu, the like or combinations thereof.

Referring to FIGS. 1B-1D, the spacers 120 of the capacitor 13 laterally surrounding the dummy gate structures C11-C14 are formed simultaneously with the gate spacers (not shown) on the metal gate structures G11-G14, and thus the spacers 120 can be formed without using additional processes and hence additional cost. Moreover, because of simultaneous formation of the capacitors and metal gates, the spacers 120 are formed of same material(s) as the gate spacers on the metal gate structures G11-G14, without additional materials and masks. The forming of the spacers 120 can increase capacitance of the capacitor 13 and improve electrical performance of the integrated circuit (IC) circuit 10. In some embodiments, the spacers 120 may have a relatively high k value, which is beneficial for increasing the capacitance of the capacitor 13. By way of example but not limitation, the spacers 120 may include silicon oxide, silicon nitride, silicon oxynitride, silicon carbide, silicon carbonitride, the like, or a combination thereof, and may also include composite layers including, for example, a silicon nitride layer on a silicon oxide layer.

In some embodiments as illustrated in FIG. 1A, the integrated circuit 10 further includes a plurality of gate contacts VG11, VG12, VG13, and VG14 over the corresponding metal gate structures G11-G14, respectively. The dummy gate contacts VC11-VC14 are formed simultaneously with the gate contacts VG11-VG14, and thus the dummy gate contacts VC11-VC14 can be formed without using additional processes and hence additional cost. Moreover, because of simultaneous formation of the capacitors and metal gates, the dummy gate contacts VC11-VC14 are formed of same material(s) as the gate contacts VG11-VG14, without additional metal materials and masks. In some embodiments, the dummy gate contacts VC11-VC14 and the gate contacts VG11-VG14 include a conductive material such as, for example, copper (Cu), tungsten (W) cobalt (Co) or other suitable metals. Formation of the dummy gate contacts VC11-VC14 and the gate contacts VG11-VG14 includes, for example, etching contact openings in an interlayer dielectric (ILD) layer (not shown) over the metal gate structures G11-G14 and dummy gate structures C11-C14, depositing one or more conductive materials in the contact openings, and planarizing the one or more conductive materials by using, for example, a CMP process. In this way, the capacitance of the capacitor 13 can be tuned by designing dummy metal gate layout patterns, dummy gate via layout patterns, metal line patterns, and/or metal via patterns.

Referring to FIGS. 1C and 1D, a contact etch stop layer (CESL) 140 is blanket formed over the dummy gate structures C11, C12, C13, and C14 and along the top surface of the STI region 110. The CESL 140 is formed simultaneously with a contact etch stop layer (not shown) over the metal gate structures G11-G14. In some embodiments, the CESL 140 may be formed of silicon nitride, silicon carbide, silicon oxide, and the like. In the depicted embodiment as illustrated in FIG. 1A, the integrated circuit 10 further includes a plurality of source/drain contacts MD landing on the respective source/drain regions S/D through the CESL 140 within the active region OD11. In some embodiments, the source/drain contacts MD includes suitable one or more metals, such as W, Cu, Cu, the like or combinations thereof.

Figure 2:
FIG. 2 is a method M of manufacturing an integrated circuit in accordance with some embodiments of the present disclosure.

Referring now to FIG. 2, illustrated is an exemplary method M for fabrication of a capacitor in an integrated circuit in accordance with some embodiments, in which the fabrication includes a process of the capacitor on a shallow trench isolation (STI) region. The method M includes a relevant part of the entire manufacturing process. It is understood that additional operations may be provided before, during, and after the operations shown by FIG. 2, and some of the operations described below can be replaced or eliminated for additional embodiments of the method. The order of the operations/processes may be interchangeable. It is noted that FIG. 2 has been simplified for a better understanding of the disclosed embodiment. Moreover, the integrated circuit may be configured as a system-on-chip (SoC) device having various PMOS and NMOS transistors that are fabricated to operate at different voltage levels.

Figure 3A:
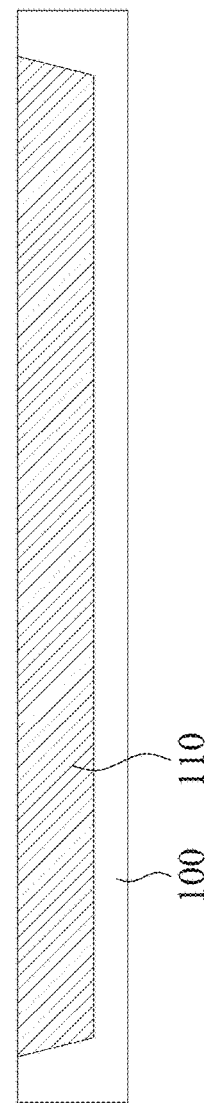
FIGS. 3A to 16B illustrate cross-sectional views of intermediate stages in the formation of a capacitor in an integrated circuit in accordance with some embodiments of the present disclosure.
Figure 3B:
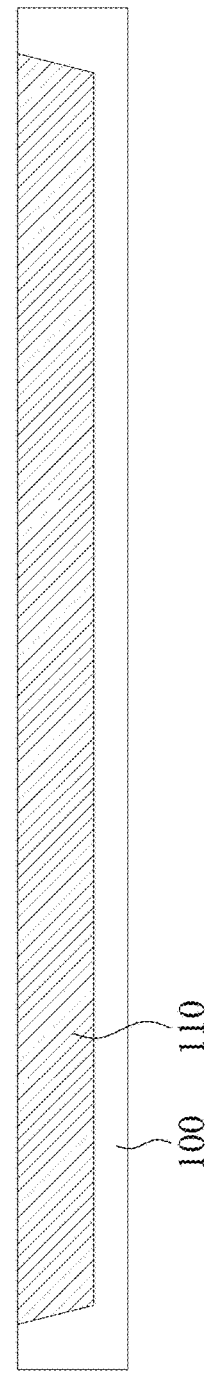

FIGS. 3A to 16B illustrate cross-sectional views of intermediate stages in the formation of the capacitor 13 in the integrated circuit 10 in accordance with some embodiments of the present disclosure. FIGS. 3A to 16A are cross-sectional views obtained from a vertical plane corresponding to line C-C' in FIG. 1A. FIGS. 3B to 16B are cross-sectional views obtained from a vertical plane corresponding to line D-D' in FIG. 1A. The method M begins at block S101 where one or more STI regions are formed in a substrate to define a passive region and an active region. With reference to FIGS. 3A and 3B, in some embodiments of block S101, a STI region 110 are formed in a substrate 100 to define the capacitor region 12 and the active region OD11 (as shown in FIG. 1A). Formation of the STI regions includes, by way of example and not limitation, etching the substrate 100 to form one or more trenches that define the capacitor region 12 and the active region OD11, depositing one or more dielectric materials (e.g., silicon oxide) to overfill the trenches in the substrate 100, followed by a CMP process to planarize the one or more STI regions 110 with the substrate 100.

Figure 4A:
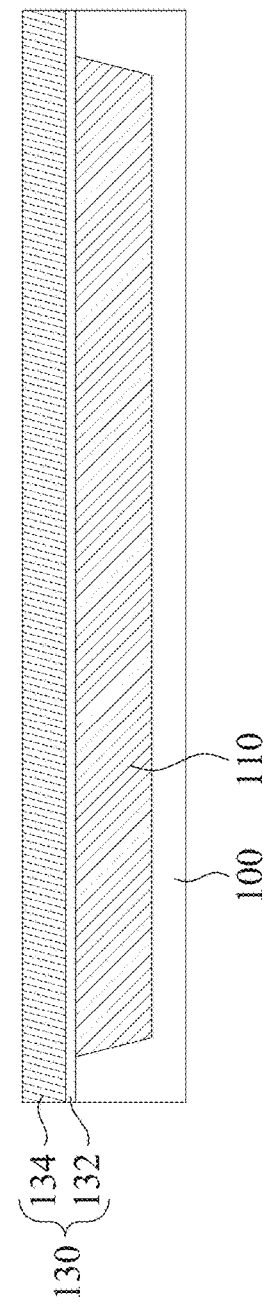
Figure 4B:
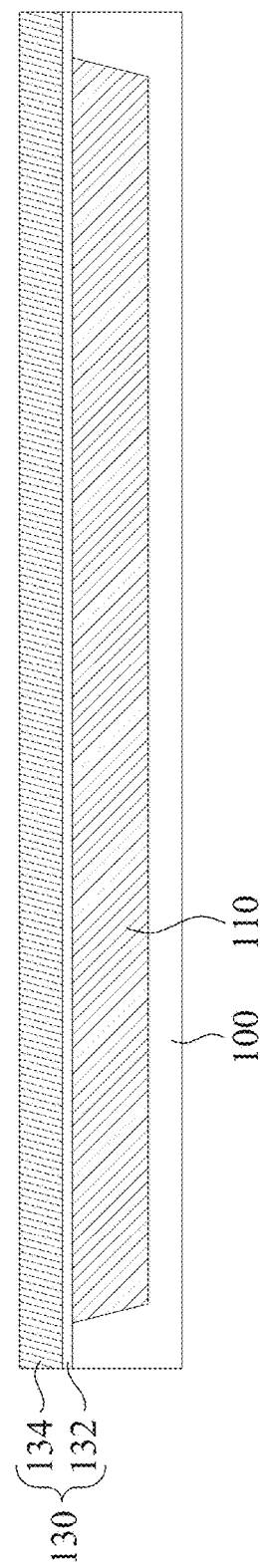

Returning to FIG. 2, the method M then proceeds to block S102 where a dielectric layer and a sacrificial layer are formed over the passive region and the active region. With reference to FIGS. 4A and 4B, in some embodiments of block S102, once formation of the STI region 110 is complete, a dielectric layer 132 is formed over the capacitor region 12 and the active region OD11 (as shown in FIG. 1A) and a sacrificial layer 134 is formed over the dielectric layer 132. In some embodiments, the dielectric layer 132 includes a stack of an interfacial dielectric material and a high-k dielectric material.

By way of example and not limitation, the dielectric layer 132 may be made of silicon oxide, silicon nitride, or the like, or the combinations thereof. In some embodiments, the dielectric layer 132 may be made of high-k gate dielectric materials include, but are not limited to, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina ($HfO_2$-$Al_2O_3$) alloy, other suitable high-k dielectric materials, and/or combinations thereof. In some embodiments, the sacrificial layer 134 may be made of doped or un-doped polysilicon.

Figure 5A:
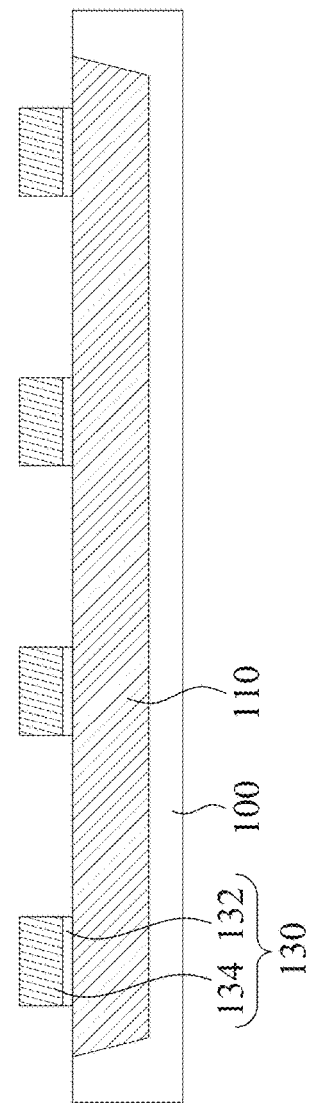
Figure 5B:
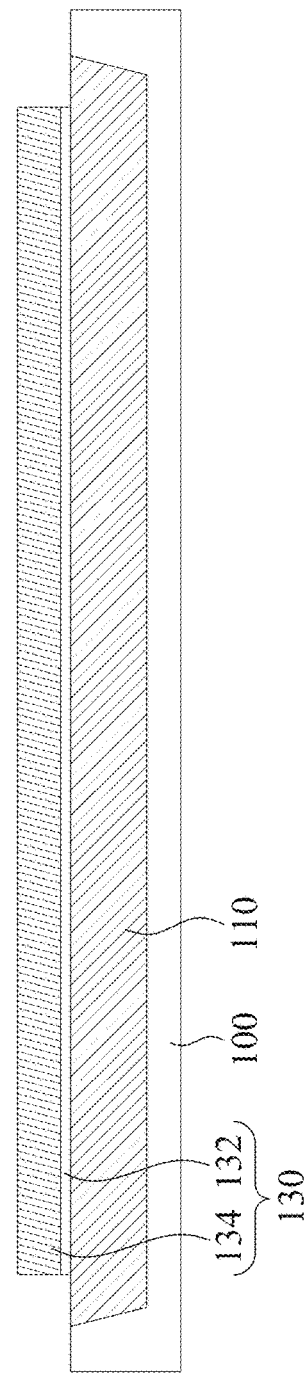

Returning to FIG. 2, the method M then proceeds to block S103 where the dielectric layer and the sacrificial layer are patterned to form sacrificial gate structures. With reference to FIGS. 5A and 5B, in some embodiments of block S103, the dielectric layer 132 and the sacrificial layer 134 are patterned by using suitable photolithography and etching techniques, resulting in sacrificial gate structures 130 each including gate dielectric material and sacrificial gate material to serve as its dielectric layer 132 and sacrificial gate 134. At the time the dielectric layer 132 and sacrificial gate 134 of the capacitor 13 is formed, a gate stack, which also includes gate dielectric 132 and sacrificial gate 134, is formed simultaneously on the active region OD11 (as shown in FIG. 1A).

Figure 6A:
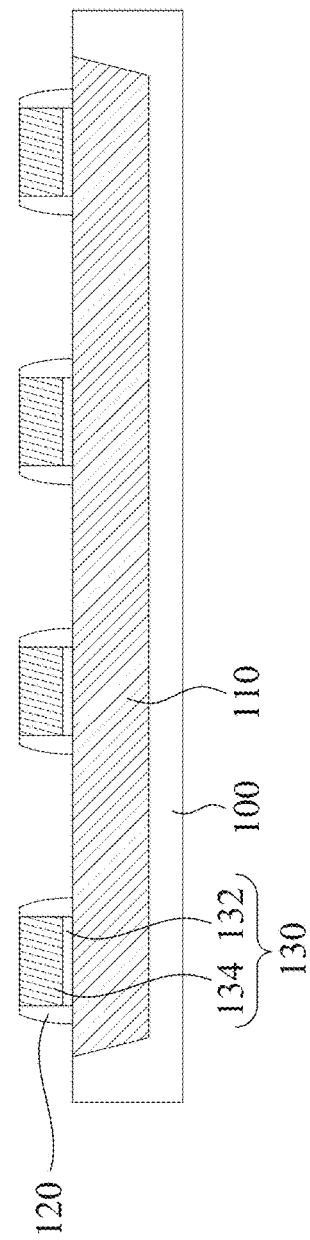
Figure 6B:
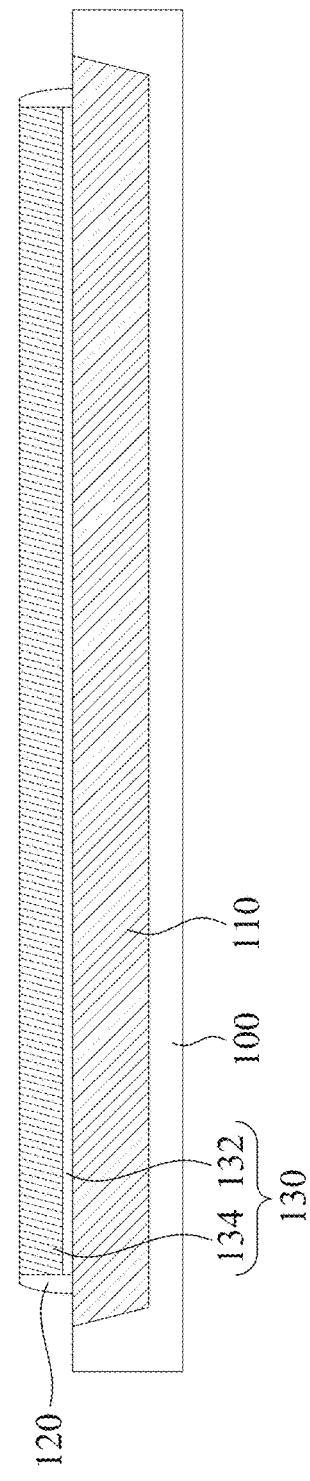

Returning to FIG. 2, the method M then proceeds to block S104 where gate spacers are then formed on opposite sidewalls of each sacrificial gate structure. With reference to FIGS. 6A and 6B, in some embodiments of block S104, spacers 120 are then formed on opposite sidewalls of each sacrificial gate structure 130. The spacers 120 may be formed by, for example, deposition and anisotropic etch of a spacer dielectric layer performed after the sacrificial gate patterning is complete. In some embodiments, the spacer dielectric layer may include one or more dielectrics, such as silicon oxide, silicon nitride, silicon oxynitride, silicon carbide, silicon carbonitride, the like, or a combination thereof. In some embodiments, the spacer 120 may also include composite layers including, for example, a silicon nitride layer on a silicon oxide layer. The anisotropic etch process removes the spacer dielectric layer from over the top of the sacrificial gate structures 130 while leaving the spacers 120 along the sidewalls of the sacrificial gate structures 130. At the time the spacers 120 of the capacitor 13 are formed, a gate spacer is simultaneously formed to laterally surround the gate stack in active region OD11 as shown in FIG. 1A.

Returning to FIG. 2, the method M then proceeds to block S105 where an ion implantation process is performed on the active region to form source/drain regions therein, such that the sacrificial gate structure within the passive region are implanted simultaneously. In some embodiments, source/drain regions S/D shown in FIG. 1A may be epitaxially grown regions. The source/drain regions S/D may be formed self-aligned to the gate spacers by first etching the active region OD11 to form recesses, and then depositing a crystalline semiconductor material in the recesses by a selective epitaxial growth (SEG) process that may fill the recesses in the active region OD11 and may extend further beyond the original surface of the active region OD11 to form raised source/drain epitaxy structures in some embodiments. The crystalline semiconductor material may be an elemental semiconductor (e.g., Si, or Ge, or the like), or an alloy semiconductor (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like.

Figure 7A:
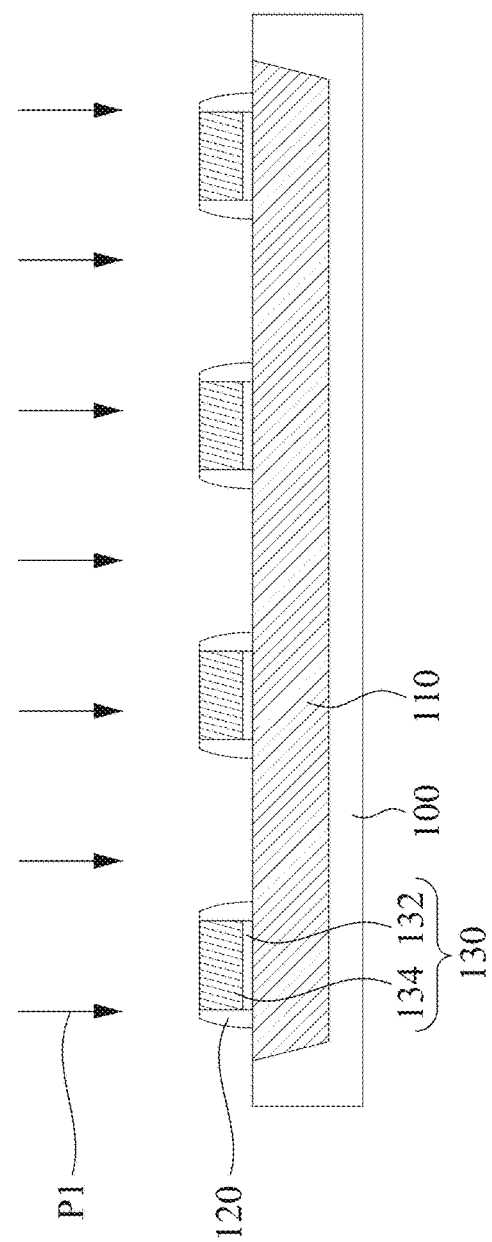
Figure 7B:
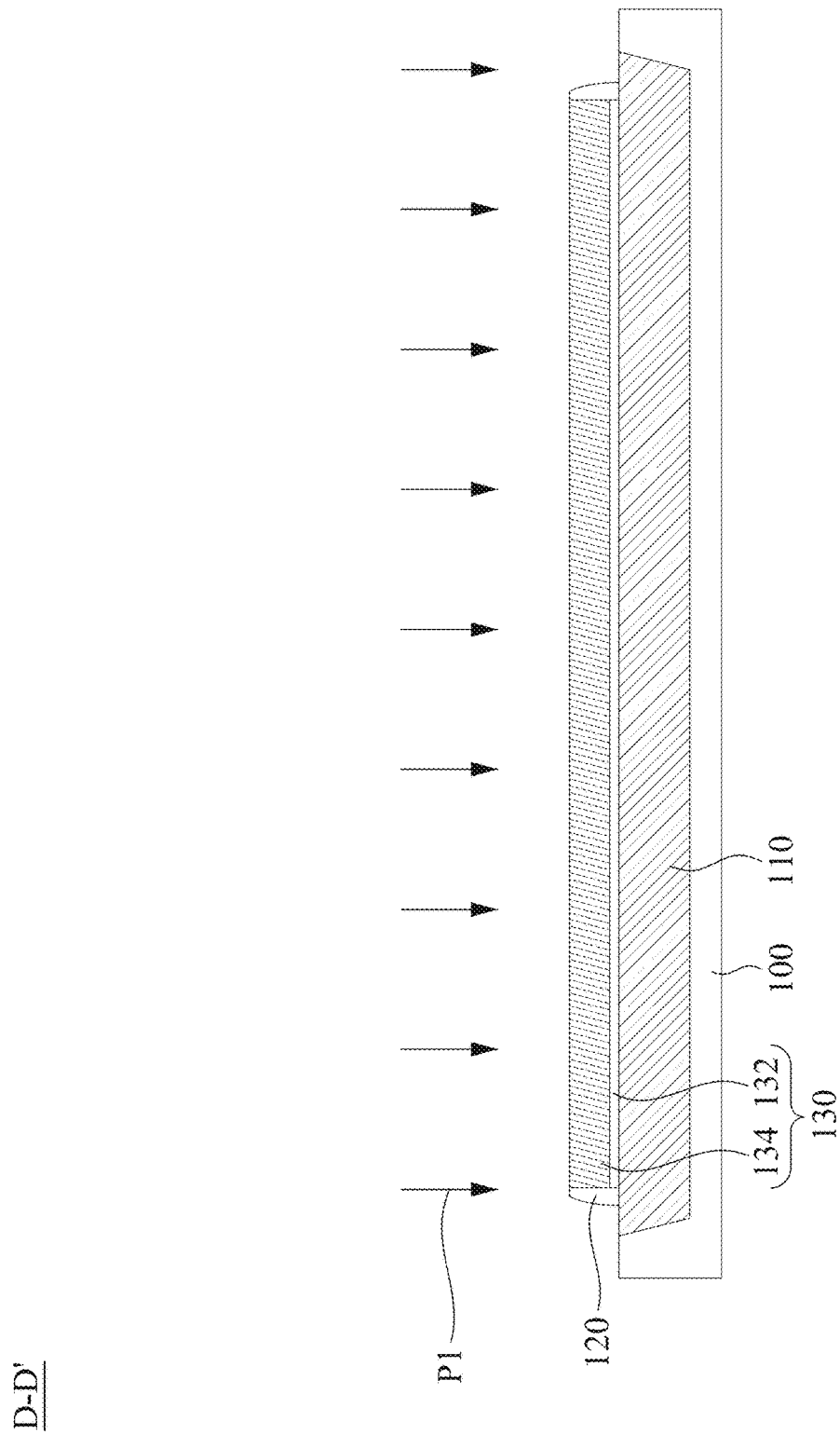

With reference to FIGS. 7A and 7B, in some embodiments of block S105, a high dose (e.g., from about $10^{14}$ $cm^{-2}$ to $10^{16}$ $cm^{-2}$) of n-type or p-type dopants may be introduced into source/drain regions S/D either in situ during SEG, or by an ion implantation process performed after the SEG, or by a combination thereof. In the depicted embodiment as illustrated in FIGS. 7A and 7B, an ion implantation process P1 is performed on the active region OD11 to form source/drain regions S/D therein, such that the sacrificial gate structures 130 within the capacitor region 12 are implanted simultaneously. Hence, the high dose (e.g., from about $10^{14}$ $cm^{-2}$ to $10^{16}$ $cm^{-2}$) of n-type or p-type dopants may be introduced into the sacrificial gate structures 130 through the ion implantation process P1, by way of example and not limitation.

Figure 8A:
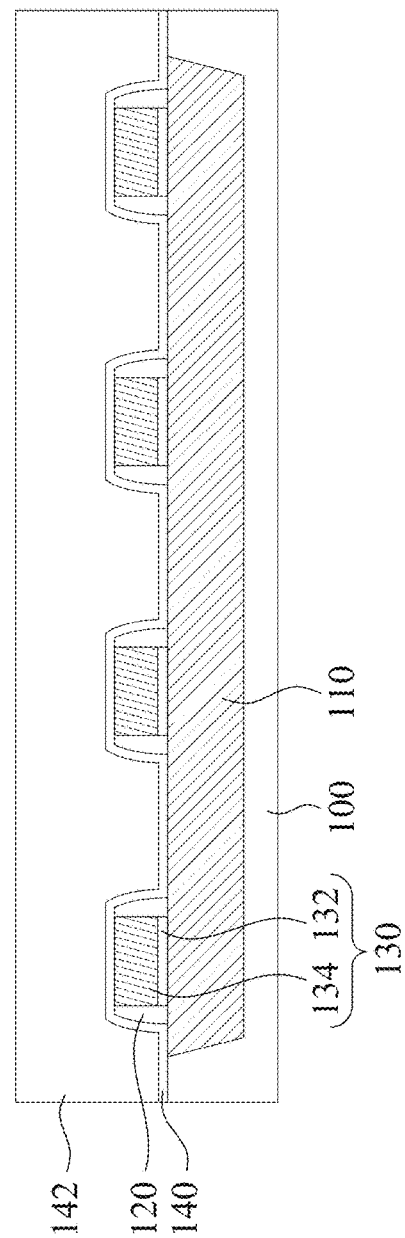

Returning to FIG. 2, the method M then proceeds to block S106 where a contact etch stop layer (CESL) and an inter-layer dielectric (ILD) layer are formed over the passive region and the active region. With reference to FIGS. 8A and 8B, in some embodiments of block S106, a contact etch stop layer (CESL) 140 is blanket formed over the sacrificial gate structures 130 and an inter-layer dielectric (ILD) layer 142 is formed over the CESL 140. In some embodiments, the CESL 140 may be formed of silicon nitride, silicon carbide, silicon oxide, and the like. In some embodiments, the ILD layer 142 may be made of silicon oxide, silicon nitride, silicon oxynitride, tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric materials used to form the ILD layer 142 may be deposited using any suitable method, such as CVD, physical vapor deposition (PVD), ALD, PEALD, PECVD, SACVD, FCVD, spin-on, and/or the like, or a combination thereof, followed by a CMP process to.

Figure 9A:
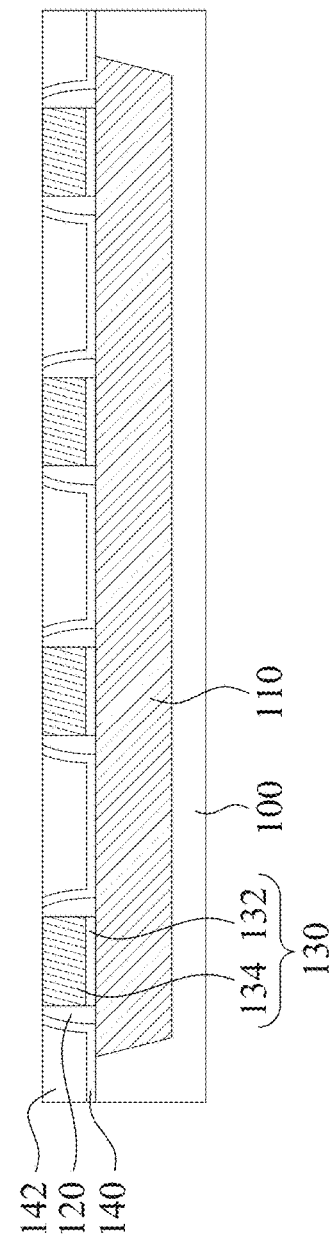
Figure 9B:
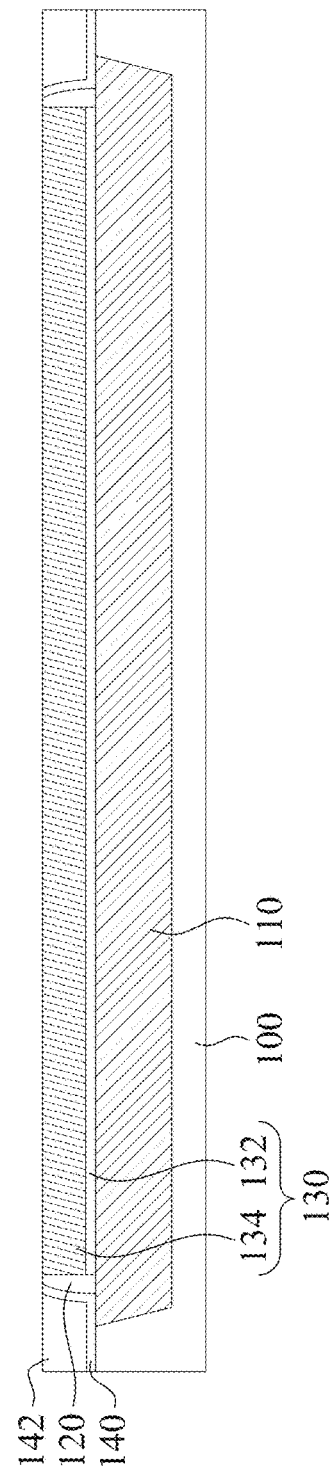

Returning to FIG. 2, the method M then proceeds to block S107 where a planarization process is performed on the CESL and the ILD layer until the sacrificial gate structures are exposed. With reference to FIGS. 9A and 9B, in some embodiments of block S107, a planarization process such as chemical mechanical polish (CMP) is performed to remove portions of the ILD layer 142 and the CESL 140 above top surfaces of the sacrificial gate structures 130 and/or top surfaces of the spacers 120, such that the top surfaces of the sacrificial gate structures 130 and/or the top surface of the spacers 120 are level the sacrificial gate structures 130.

Returning to FIG. 2, the method M then proceeds to block S108 where the sacrificial gate structures are replaced with the dummy gate structures within the passive region and the metal gate structures within the active region simultaneously. With reference to FIGS. 10A to 12B, in some embodiments of block S108, the sacrificial gate structures 130 are replaced with the dummy gate structures C11, C12, C13, and C14 within the capacitor region 12 and the metal gate structures G11, G12, G13, and G14 (as shown in FIG. 1A) within the active region OD11.

Figure 10A:
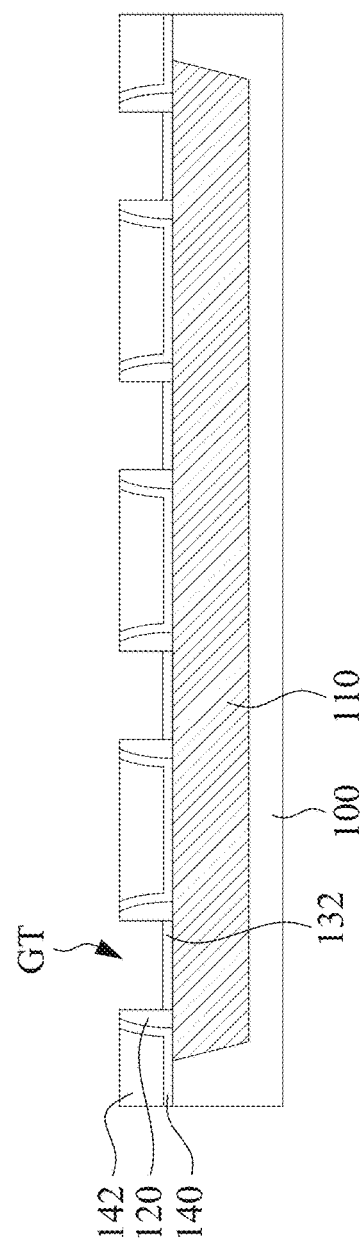
Figure 10B:
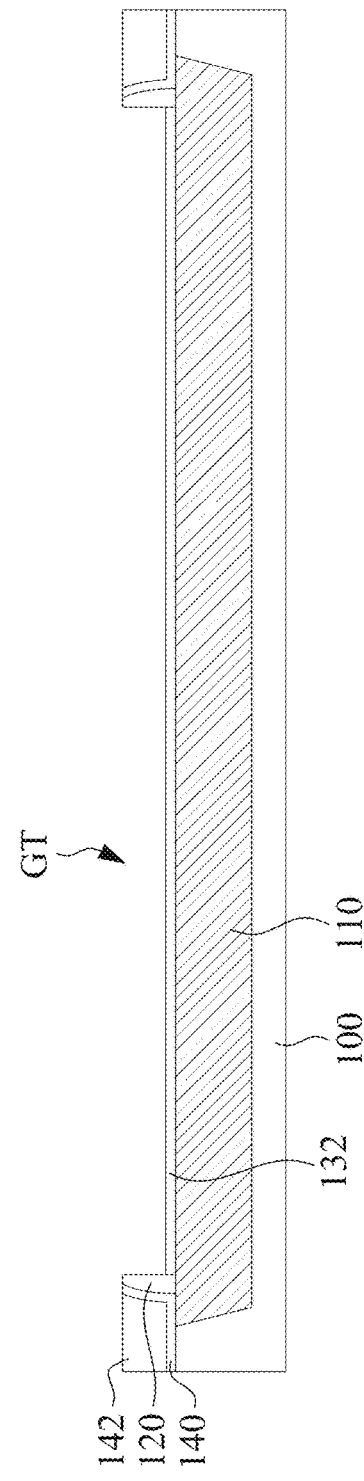
Figure 11A:
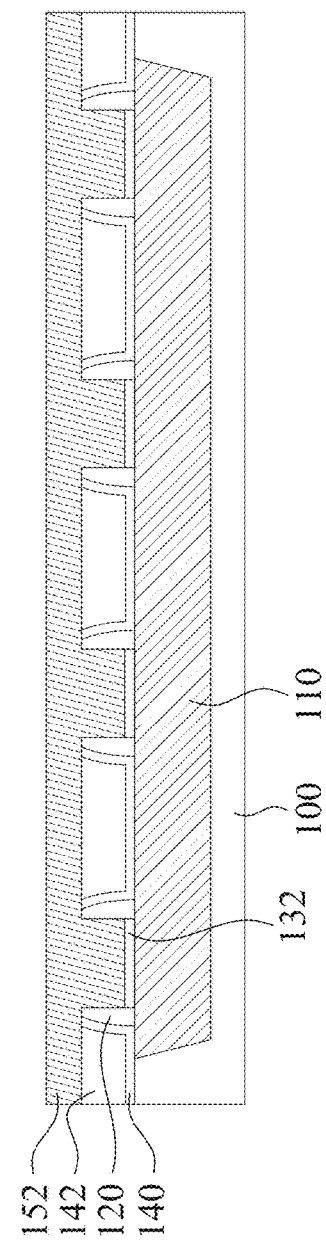
Figure 11B:
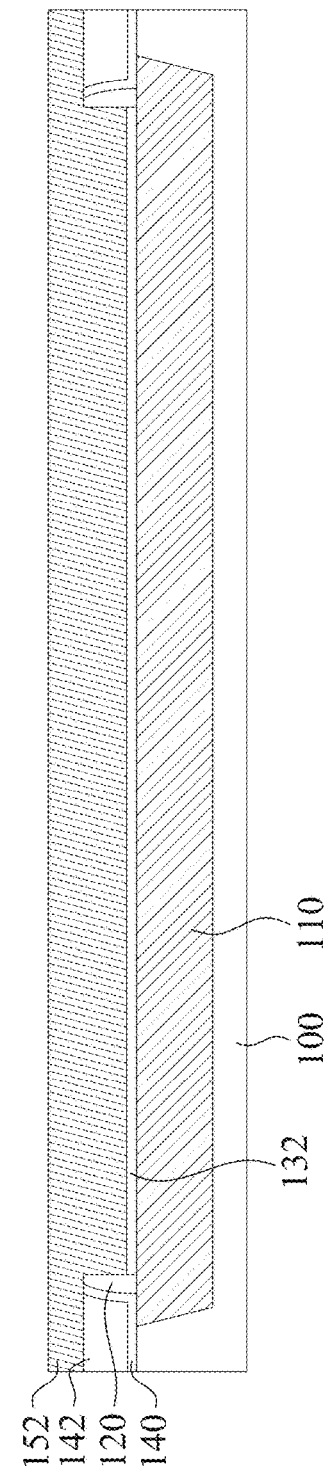
Figure 12A:
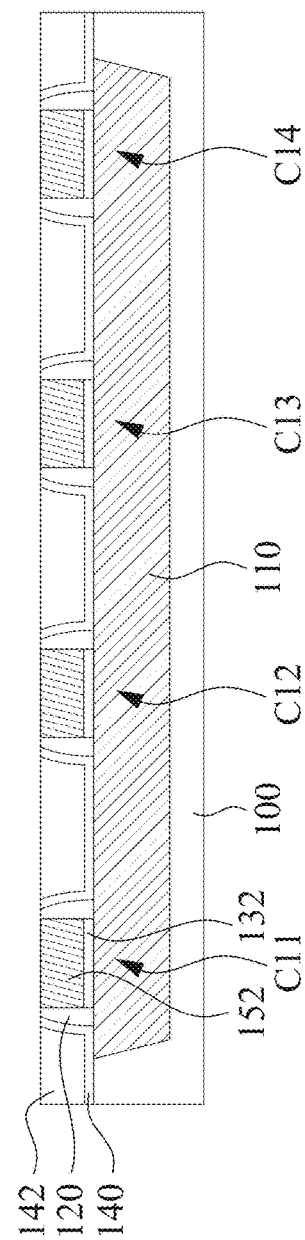
Figure 12B:
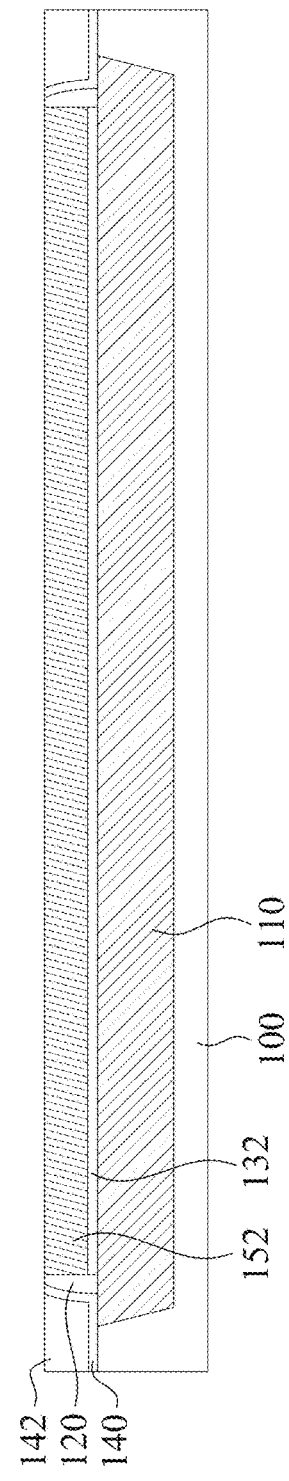

As shown in FIGS. 10A and 10B, the replacement process on the capacitor region 12 includes, by way of example and not limitation, removing the sacrificial gate 134 using one or more etching techniques (e.g., dry etching, wet etching or combinations thereof), thereby creating trenches GT between respective spacers 120. Next, as shown in FIGS. 11A and 11B, a metal layer 152 including one or more metals, are deposited to completely fill the trenches GT. Next, as shown in FIGS. 12A and 12B, excess portions of the metal layer 152 are then removed from over the top surface of the ILD layer 142 using, for example, a CMP process. The resulting structure may include remaining portions of the metal layer 152 inlaid between respective spacers 120 to serve as dummy gate structures C11-C14 within the capacitor region 12 (as shown in FIG. 1A). At the time the dummy gate structures C11-C14 of the capacitor 13 are formed, the metal gate structures G11-G14 is simultaneously formed within the active region OD11 (as shown in FIG. 1A).

The materials used in forming the dummy gate structures C11-C14 and the metal gate structures G11-G14 may be deposited by any suitable method, e.g., CVD, PECVD, PVD, ALD, PEALD, electrochemical plating (ECP), electroless plating and/or the like. In some embodiments, the metal layer 152 is a single layer structure or a multi-layer structure including, for example, copper (Cu), aluminum (Al), titanium (Ti), titanium nitride (TiN), tantalum (Ta), tantalum nitride (TaN), tantalum carbide (TaC), tantalum silicon nitride (TaSiN), tungsten (W), tungsten nitride (WN), molybdenum nitride (MoN), the like and/or combinations thereof.

Figure 13A:
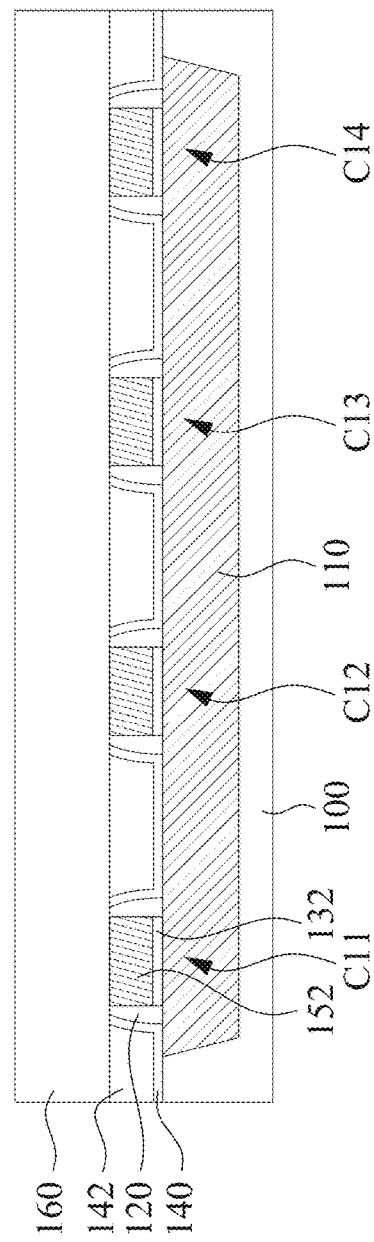
Figure 13B:
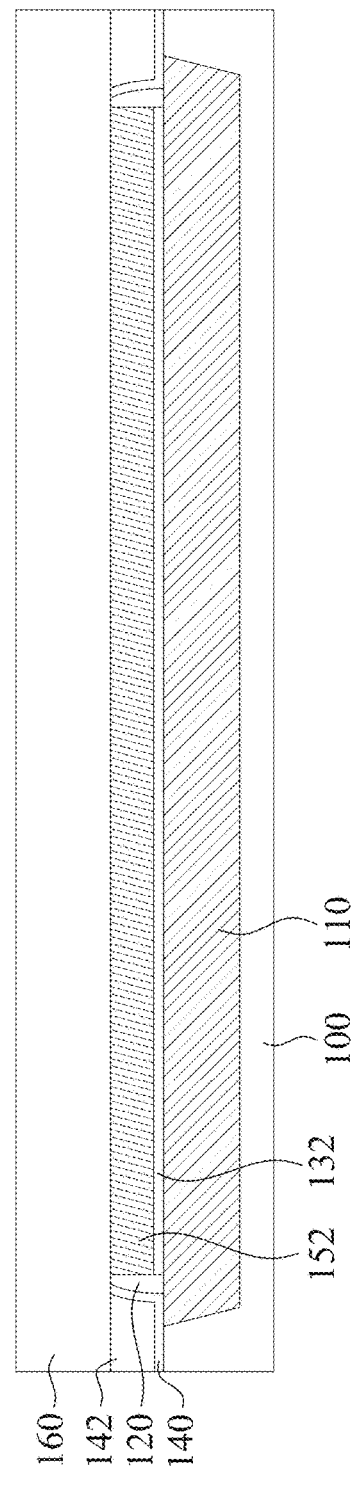
Figure 14A:
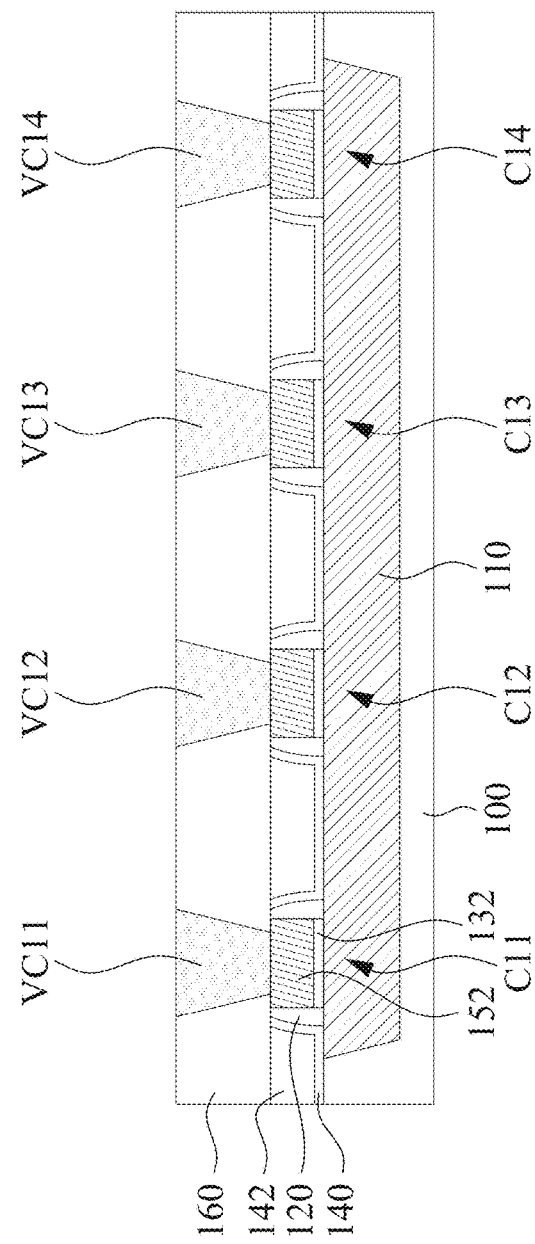
Figure 14B:
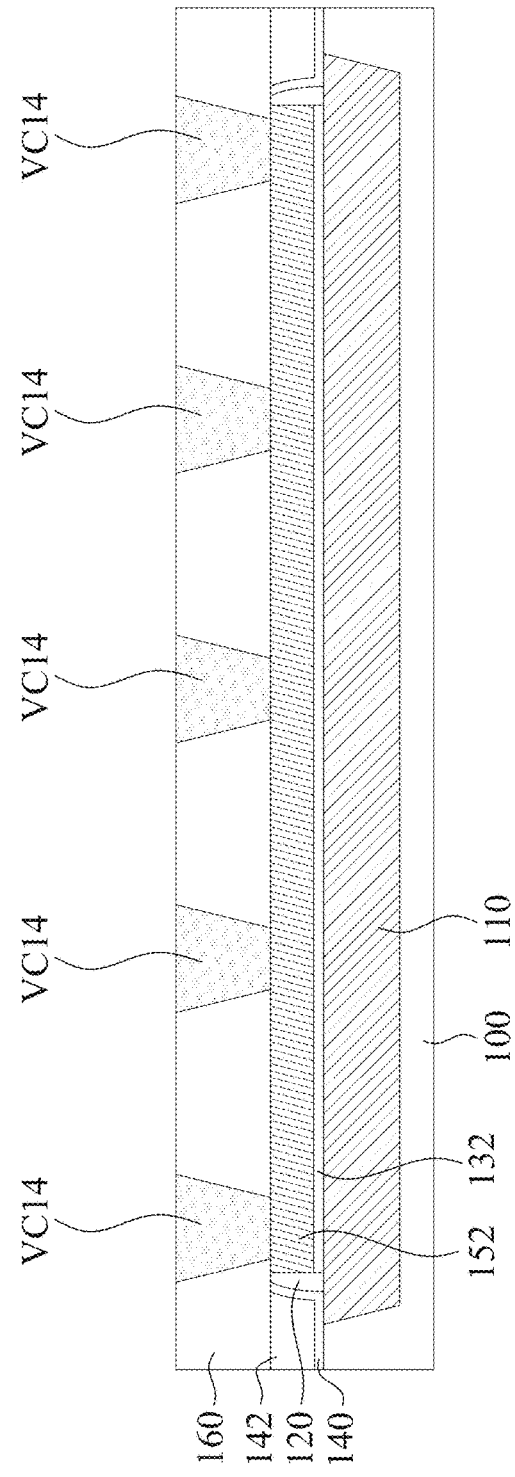

Returning to FIG. 2, the method M then proceeds to block S109 where dummy gate contacts are formed to land on the dummy gate structures within the passive region and gate contacts are formed to land on the metal gate structures within the active region simultaneously. With reference to FIGS. 13A and 13B, in some embodiments of block S108, the ILD layer 160 is formed over the capacitor region 12 and spans the dummy gate structures C11, C12, C13, and C14. Next, as shown in FIGS. 14A and 14B, the dummy gate contacts VC11-VC14 are then formed to land on the dummy gate structures C11-C14. The dummy gate contacts VC11-VC14 and gate contacts VG11-VG14 (as shown in FIG. 1A) are formed simultaneously by using photolithography, etching and deposition techniques. For example, a patterned mask may be formed over the ILD layer 160 and used to etch contact openings that extend through the ILD layer 160 to expose the dummy gate structures C11-C14 as well as metal gate structures G11-G14. In particular, these contact openings exposes only a single region of a metal gate structure but a plurality of separate regions of a capacitor structure. Thereafter, one or more metals (e.g., tungsten or copper) are deposited to fill the contact openings in the ILD layer 150 by using any acceptable deposition technique (e.g., CVD, ALD, PEALD, PECVD, PVD, ECP, electroless plating, or the like, or any combination thereof). Next, a planarization process (e.g., CMP) may be used to remove excess metals from above the top surface of the ILD layer 150. The resulting conductive plugs fill the contact openings in the ILD layer 150 and constitute dummy gate contacts VC11-VC14 making physical and electrical connections to the dummy gate structures C11-C14 and gate contacts VG11-VG14 making physical and electrical connections to the metal gate structures G11-G14. In particular, only a single gate contact is formed on a metal gate structure, but two dummy gate contacts are formed on a dummy gate structure to serve as a dummy gate-to-dummy gate capacitance of the capacitor 13.

In some embodiments, the ILD layer 160 may be made of silicon oxide, silicon nitride, silicon oxynitride, tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dummy gate contacts VC11-VC14 may be formed of copper (Cu), aluminum (Al), titanium (Ti), titanium nitride (TiN), tantalum (Ta), tantalum nitride (TaN), tantalum carbide (TaC), tantalum silicon nitride (TaSiN), tungsten (W), tungsten nitride (WN), molybdenum nitride (MoN), the like and/or combinations thereof.

Figure 15A:
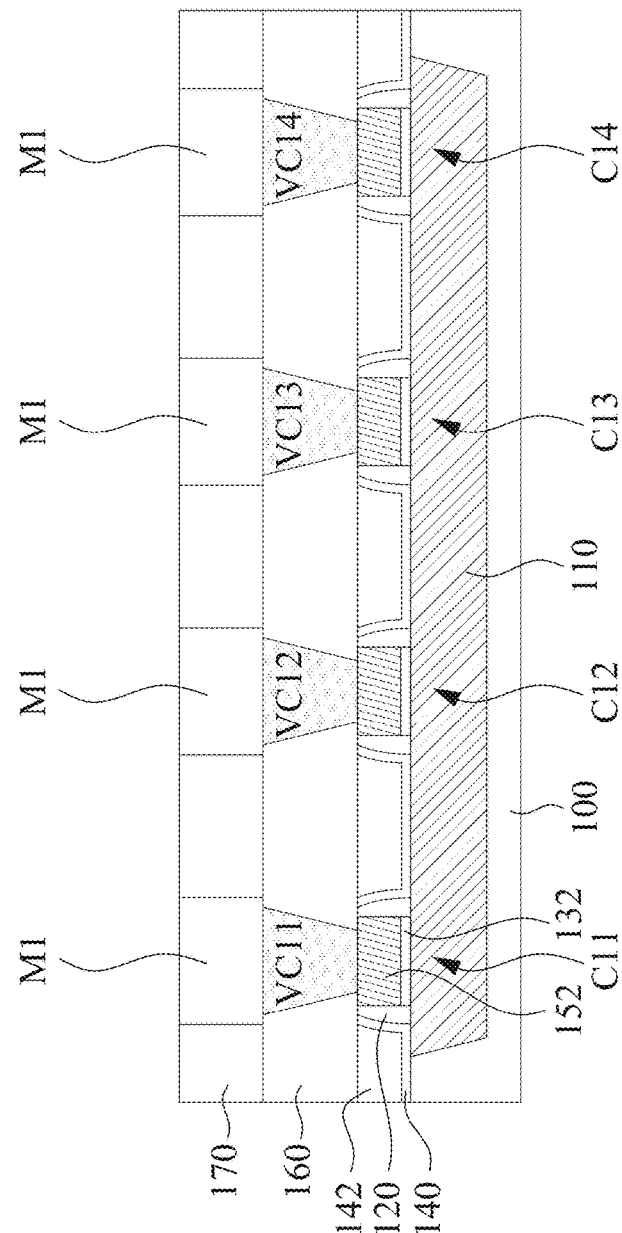
Figure 15B:
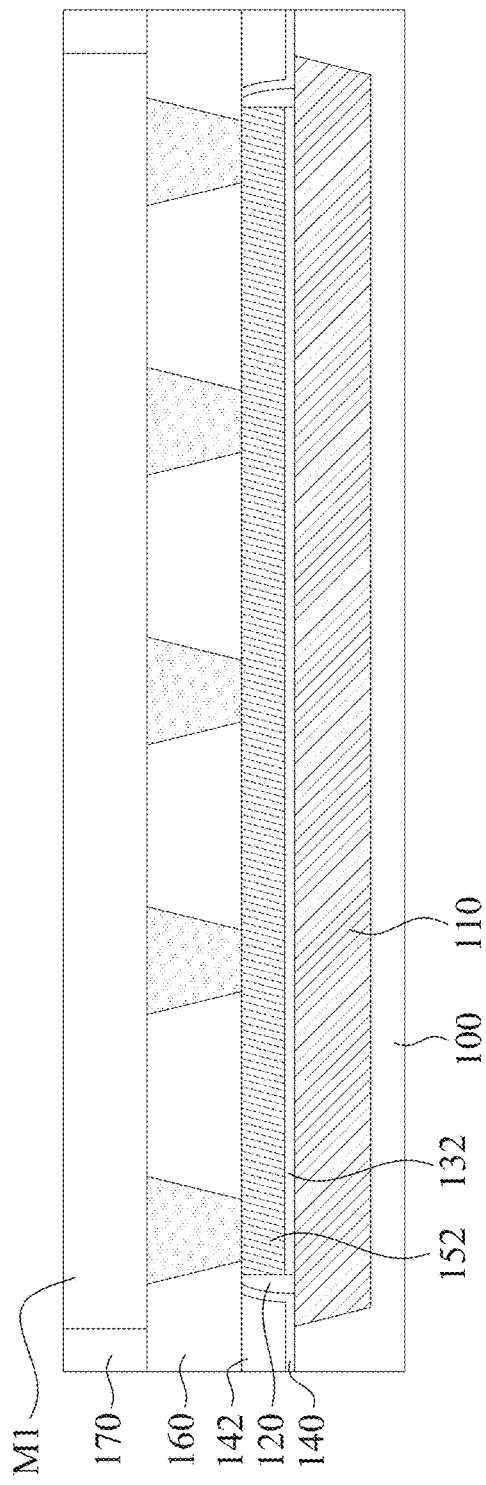

Returning to FIG. 2, the method M then proceeds to block S109 where a plurality of metal lines and a plurality of metal vias are formed over the dummy gate contacts to form a capacitor with the dummy gate contacts and the dummy gate structures. With reference to FIGS. 15A and 15B, in some embodiments of block S109, the ILD layer 170 is formed over the capacitor region 12 and spans constitute dummy gate contacts VC11-VC14. Next, the metal lines M1 are then formed in the ILD layer 170 and over corresponding dummy gate contacts VC11-VC14 to connect the corresponding dummy gate contacts VC11-VC14. The metal lines M1 are formed by using photolithography, etching and deposition techniques. For example, a patterned mask may be formed over the ILD layer 170 and used to etch trenches that extend in the ILD layer 170 to expose the dummy gate contacts VC11-VC14. Thereafter, one or more metals (e.g., tungsten or copper) are deposited to fill the trenches in the ILD layer 170 by using any acceptable deposition technique (e.g., CVD, ALD, PEALD, PECVD, PVD, ECP, electroless plating, or the like, or any combination thereof). Next, a planarization process (e.g., CMP) may be used to remove excess metals from above a top surface of the ILD layer 170. The remaining metals extend in the ILD layer 170 and constitute metal lines M1 making physical and electrical connections to the dummy gate contacts VC11-VC14. Although not shown (for the sake of simplicity and clarity), additional metal lines are also formed over the gate contacts VG11-VG14 (as shown in FIG. 1A) simultaneously with formation of the metal lines M1.

In some embodiments, the metal lines M1 may be formed of copper (Cu), aluminum (Al), titanium (Ti), titanium nitride (TiN), tantalum (Ta), tantalum nitride (TaN), tantalum carbide (TaC), tantalum silicon nitride (TaSiN), tungsten (W), tungsten nitride (WN), molybdenum nitride (MoN), the like and/or combinations thereof.

Figure 16A:
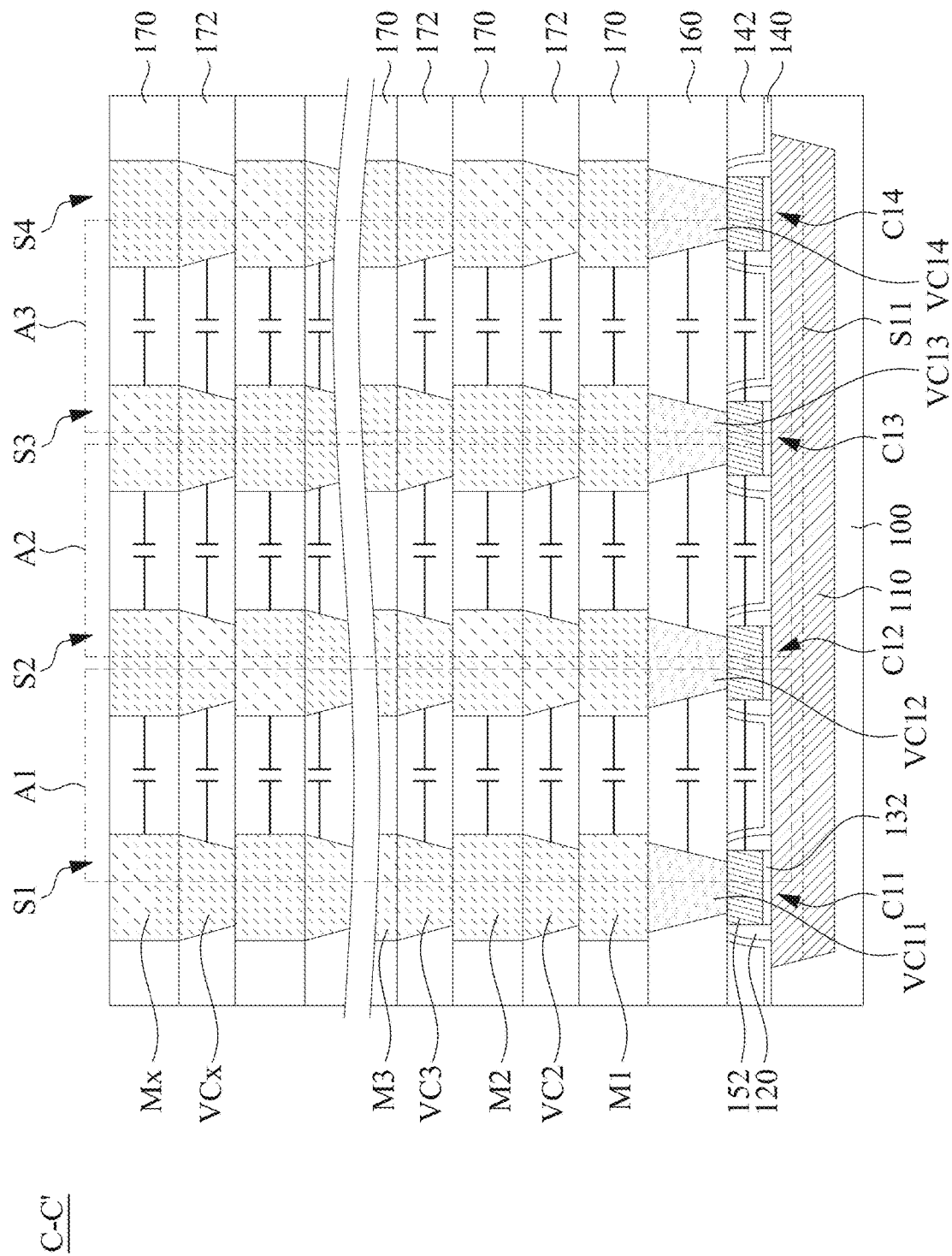
Figure 16B:
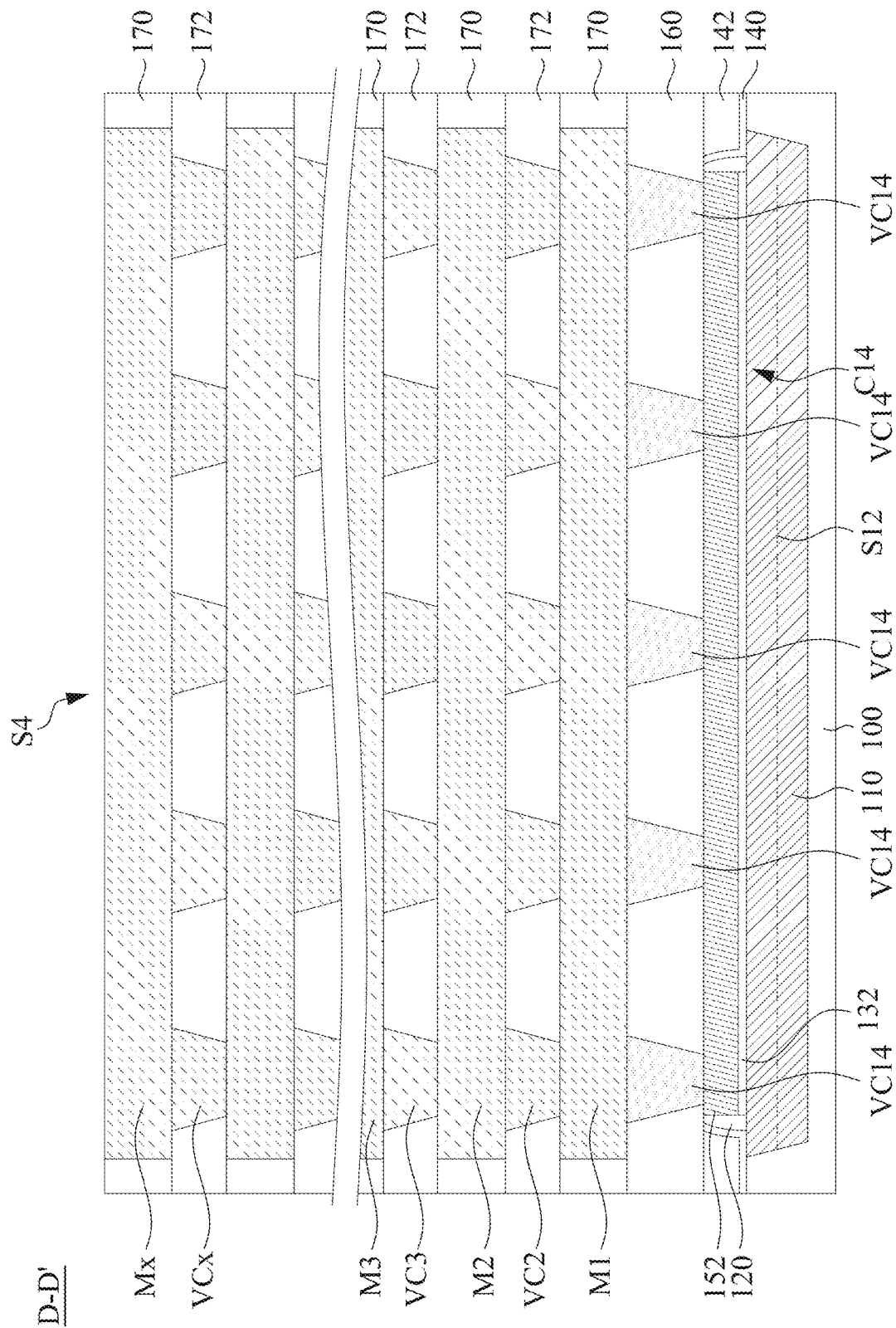

As shown in FIGS. 16A and 16B, metal lines M2 through Mx are formed in the ILD layers 170 and metal vias VC2 through VCx are formed in the ILD layers 172. In some embodiments, the ILD layer 172 is formed of same material as the ILD layer 170. Each of the metal lines M2 through Mx may have a similar pattern as the metal lines M1. The ILD layers 170 and 172, the metal lines M2 through Mx, and the metal vias VC2 through VCx are formed by the same or similar configurations and/or materials as described with FIGS. 15A and 15B. In some embodiments, the metal lines M2 through Mx are formed using a single damascene process. In some embodiments, the metal lines M2 through Mx and the metal vias VC2 through VCx are formed using a dual damascene process. Hence, the capacitor 13 is formed by the metal lines M1 through Mx and the metal vias VC2 through VCx with the dummy gate structures C11-C14 and the dummy gate contacts VC13.

Figure 17:
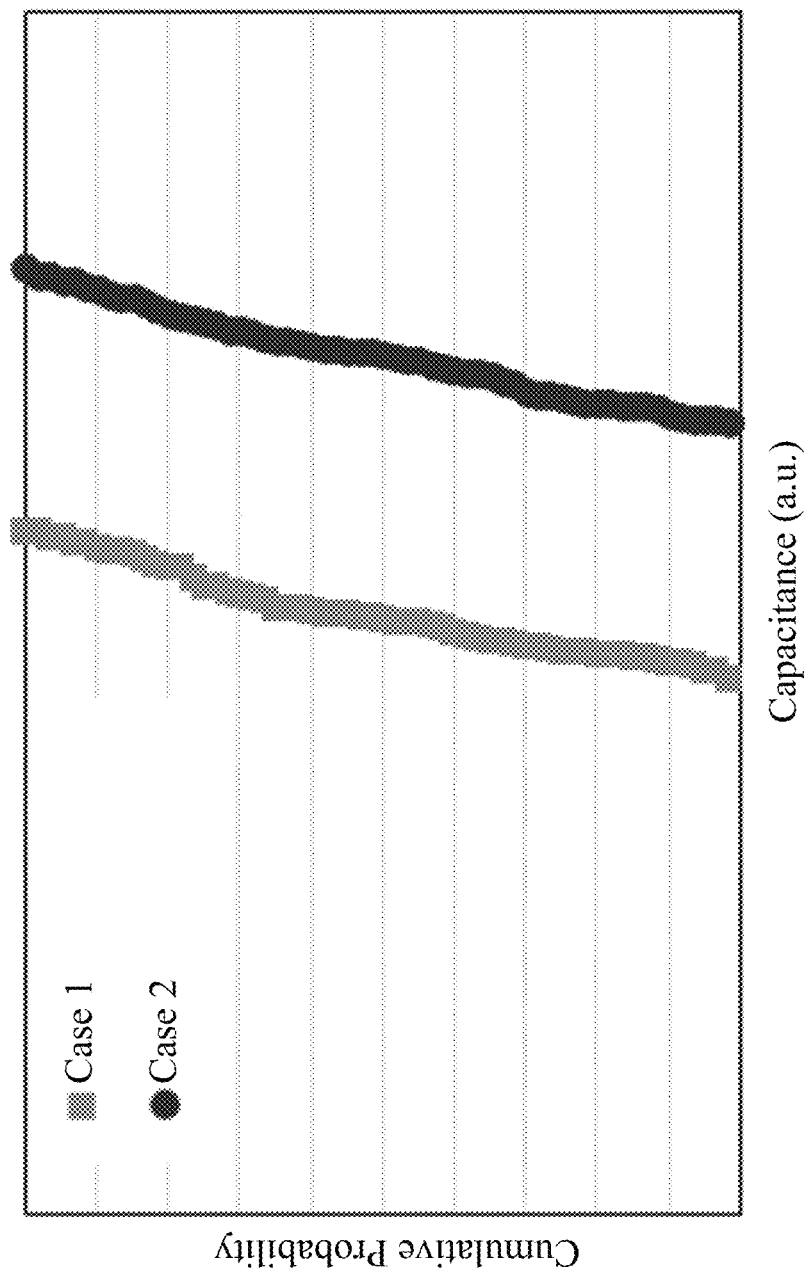
FIG. 17 is a diagram showing a comparison of performances of exemplary capacitors in accordance with some embodiments of the present disclosure.

FIG. 17 is a diagram showing a comparison of performances of exemplary capacitors in accordance with some embodiments of the present disclosure. Case 1 in the diagram is an experimental data of a capacitor including metal lines as shown in FIG. 1B, but without metal vias, dummy gate structures, and dummy gate contacts. Case 2 in the diagram is an experimental data of a capacitor including metal lines, metal vias, dummy gate structures, and dummy gate contacts as shown in FIG. 1B. As shown in FIG. 17, in each cumulative probability, the capacitance of the capacitor of Case 2 is higher than the capacitance of the capacitor of Case 1. In the capacitor of Case 1, the capacitance includes the metal line-to-metal line capacitance. In the other capacitor of Case 2, the capacitance includes the dummy gate-to-dummy gate capacitance, metal line-to-metal line capacitance, via-to-via capacitance, and contact-to-contact capacitance. The capacitor of case 2 including the metal vias, the dummy gate structures, and the dummy gate contacts has a capacitance that may be at least about 25% higher than that of the capacitor of case 1 without the metal vias, the dummy gate structures, and the dummy gate contacts, by way of example but not limitation. Therefore, the diagram reveals that the forming of the metal vias, the dummy gate structures, and the dummy gate contacts in the capacitor can increase capacitance of the capacitor, and thus improve electrical performance of the integrated circuit (IC) circuit.

Figure 18:
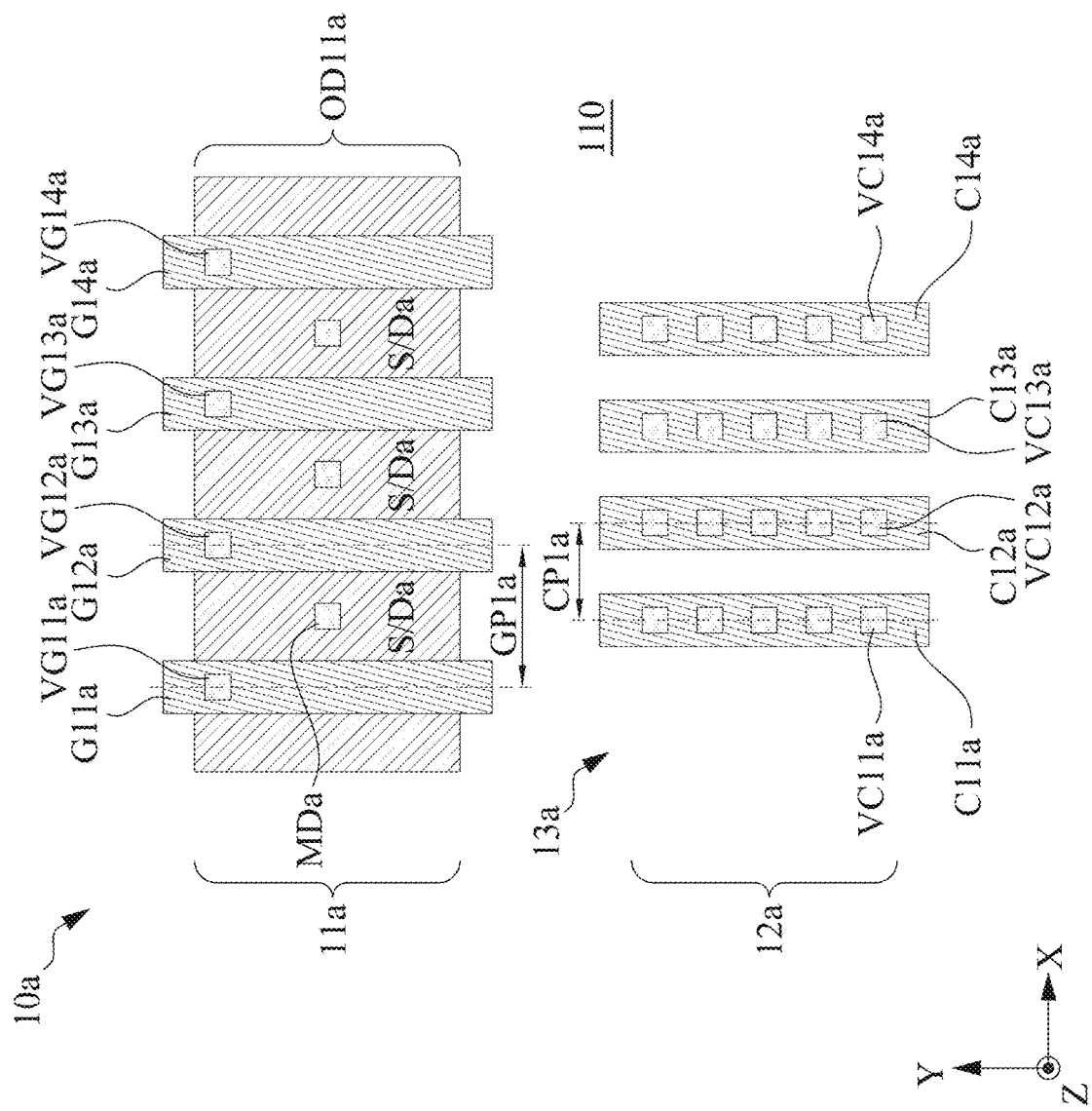
FIGS. 18 to 20 illustrate top views of different integrated circuits in accordance with some embodiments of the present disclosure.

FIG. 18 illustrates a top view of an integrated circuit in accordance with some embodiments of the present disclosure. It is noted that some elements are not illustrated in FIG. 18 for brevity. The same or similar configurations and/or materials as described with FIGS. 1A to 1D may be employed in FIG. 18, and the detailed explanation may be omitted. In some embodiments, configurations and/or materials of an active region OD11a, metal gate structures G11a-G14a, gate contacts VG11a-VG14a, source/drain contacts MDa, source/drain regions S/Da, a STI region 110a, dummy gate structures C11a-C14a, and dummy gate contacts VC11a-VC14a as shown in FIG. 18 may be substantially the same as or comparable to that of the active region OD11, the metal gate structures G11-G14, the gate contacts VG11-VG14, the source/drain contacts MD, the source/drain regions S/D, the STI region 110, the dummy gate structures C11-C14, and the dummy gate contacts VC11-VC14 as shown in FIGS. 1A to 1D, and the related detailed descriptions may refer to the foregoing paragraphs, and are not described again herein.

In FIG. 18, the metal gate structures G11a-G14a are equidistantly arranged along the X-direction at a gate pitch GP1a, and the dummy gate structures C11a-C14a are equidistantly arranged along the X-direction at a gate pitch CP1a. The difference between the present embodiment and the embodiment in FIGS. 1A to 1D is that the gate pitch CP1a shown is narrower than the gate pitch GP1a of the metal gate structures G11a-G14a. The dummy gate-to-dummy gate capacitance formed by the dummy gate structures C11a-C14a may be in correlation with the gate pitch CP1a of the dummy gate structures C11a-C14a, and thus the gate pitch CP1a can be selected depending on a desired capacitance of the capacitor 13a.

Figure 19:
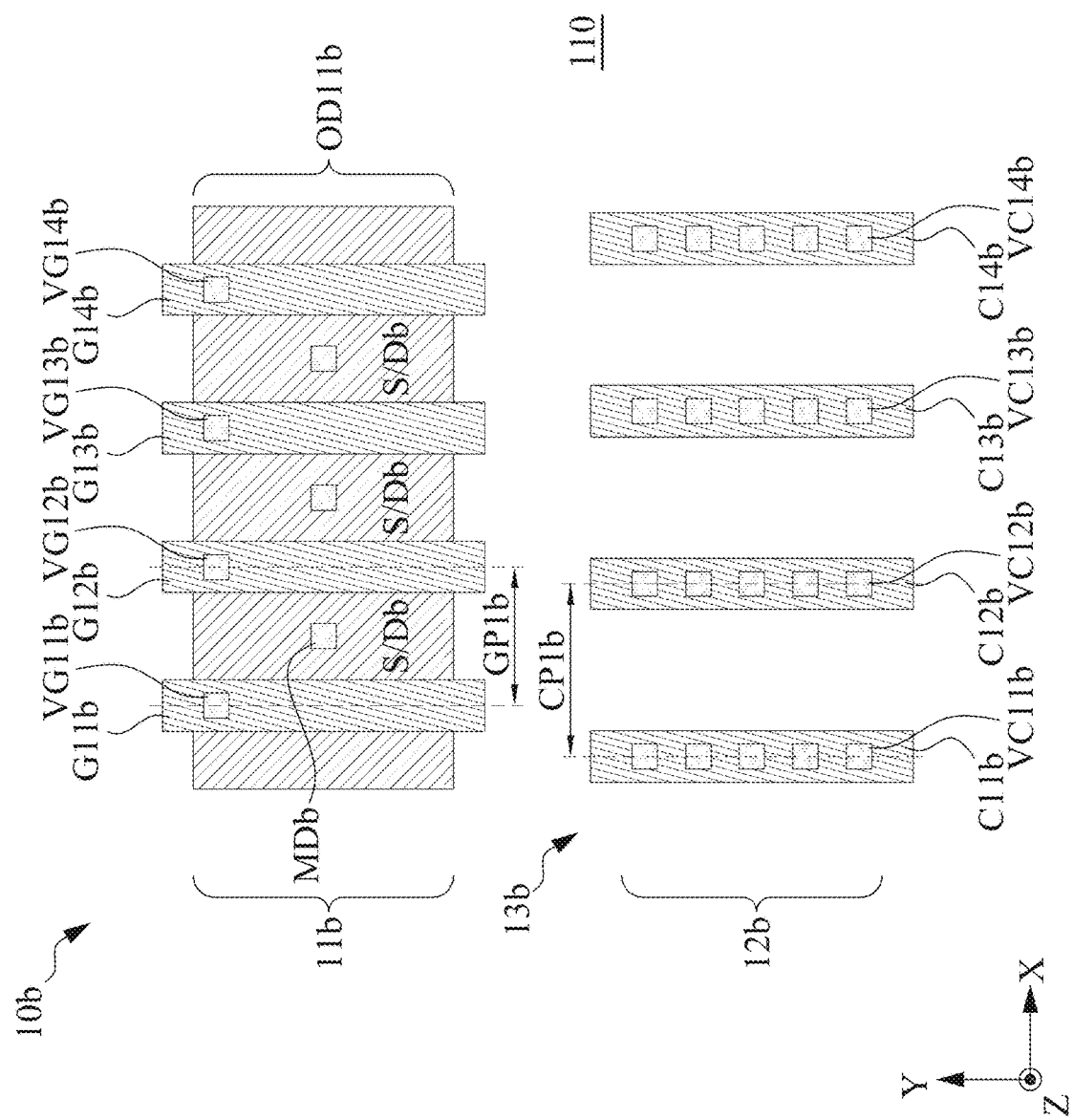

FIG. 19 illustrates a top view of an integrated circuit in accordance with some embodiments of the present disclosure. It is noted that some elements are not illustrated in FIG. 19 for brevity. The same or similar configurations and/or materials as described with FIGS. 1A to 1D may be employed in FIG. 19, and the detailed explanation may be omitted. In some embodiments, configurations and/or materials of an active region OD11b, metal gate structures G11b-G14b, gate contacts VG11b-VG14b, source/drain contacts MDb, source/drain regions S/Db, a STI region 110b, dummy gate structures C11b-C14b, and dummy gate contacts VC11b-VC14b as shown in FIG. 19 may be substantially the same as or comparable to that of the active region OD11, the metal gate structures G11-G14, the gate contacts VG11-VG14, the source/drain contacts MD, the source/drain regions S/D, the STI region 110, the dummy gate structures C11-C14, and the dummy gate contacts VC11-VC14 as shown in FIGS. 1A to 1D, and the related detailed descriptions may refer to the foregoing paragraphs, and are not described again herein.

In FIG. 19, the metal gate structures G11b-G14b are equidistantly arranged along the X-direction at a gate pitch GP1b, and the dummy gate structures C11b-C14b are equidistantly arranged along the X-direction at a gate pitch CP1b. The difference between the present embodiment and the embodiment in FIGS. 1A to 1D is that the gate pitch CP1b shown is wider than the gate pitch GP1b of the metal gate structures G11b-G14b. The dummy gate-to-dummy gate capacitance formed by the dummy gate structures C11b-C14b may be in correlation with the gate pitch CP1b of the dummy gate structures C11b-C14b, and thus the gate pitch CP1b can be selected depending on a desired capacitance of the capacitor 13b.

Figure 20:
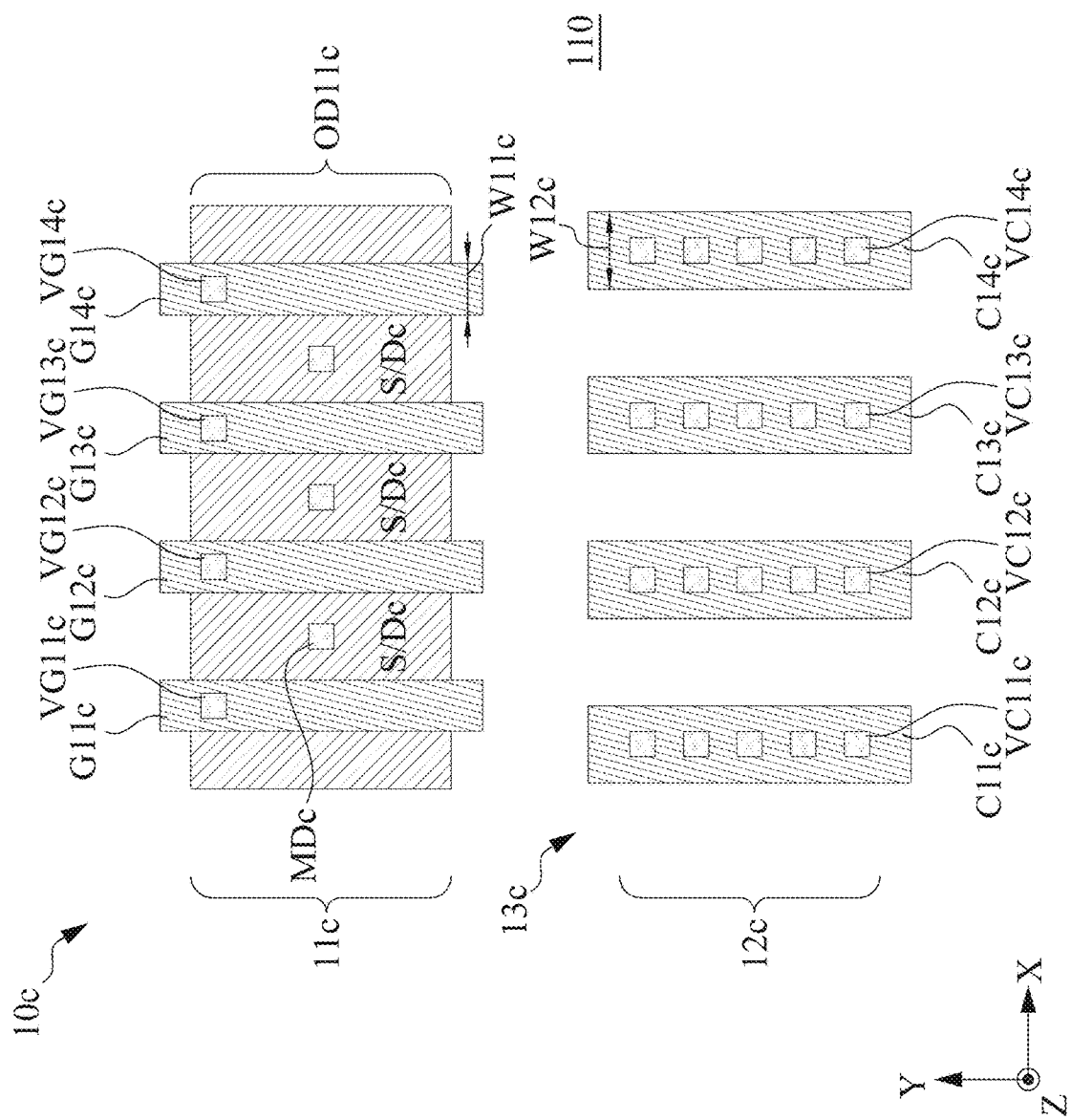

FIG. 20 illustrates a top view of an integrated circuit in accordance with some embodiments of the present disclosure. It is noted that some elements are not illustrated in FIG. 20 for brevity. The same or similar configurations and/or materials as described with FIGS. 1A to 1D may be employed in FIG. 20, and the detailed explanation may be omitted. In some embodiments, configurations and/or materials of an active region OD11c, metal gate structures G11c-G14c, gate contacts VG11c-VG14c, source/drain contacts MDc, source/drain regions S/Dc, a STI region 110c, dummy gate structures C11c-C14c, and dummy gate contacts VC11c-VC14c as shown in FIG. 20 may be substantially the same as or comparable to that of the active region OD11, the metal gate structures G11-G14, the gate contacts VG11-VG14, the source/drain contacts MD, the source/drain regions S/D, the STI region 110, the dummy gate structures C11-C14, and the dummy gate contacts VC11-VC14 as shown in FIGS. 1A to 1D, and the related detailed descriptions may refer to the foregoing paragraphs, and are not described again herein.

In FIG. 20, the metal gate structures G11c-G14c each have a gate width W11c measured in the X-direction, and the dummy gate structures C11c-C14c each have a capacitor width W12c measured in the X-direction. The difference between the present embodiment and the embodiment in FIGS. 1A to 1D is that the capacitor width W12c of the dummy gate structures C11c-C14c is wider than the gate width W11c of the metal gate structures G11b-G14b. The dummy gate-to-dummy gate capacitance formed by the dummy gate structures C11c-C14c may be in correlation with the capacitor width W12c of the dummy gate structures C11c-C14c, and thus the capacitor width W12c can be selected depending on a desired capacitance of the capacitor 13c.

Figure 21:
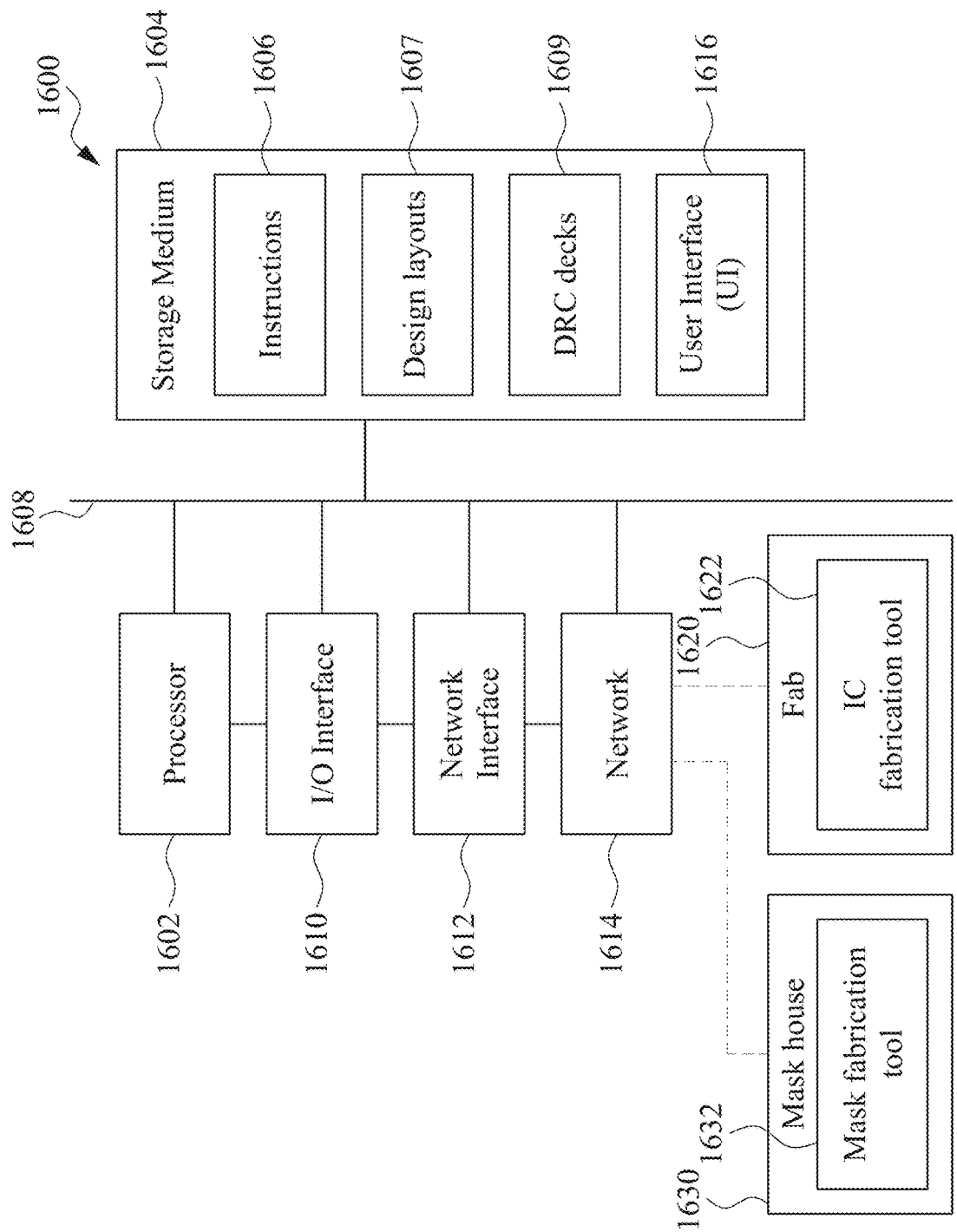
FIG. 21 is a schematic diagram of an electronic design automation (EDA) system in accordance with some embodiments of the present disclosure.

FIG. 21 is a schematic diagram of an electronic design automation (EDA) system 1600, in accordance with some embodiments. Methods described herein of generating design layouts, e.g., layouts of the integrated circuits 10, 20, 30, 40, 50, 60, 70, 80, 90, 1000, 1100, 1200, 1300, 1400 and/or 1500 with capacitors as discussed above, in accordance with one or more embodiments, are implementable, for example, using EDA system 1600, in accordance with some embodiments. In some embodiments, EDA system 1600 is a general purpose computing device that is capable of executing an APR operation. The EDA system 1600 including a hardware processor 1602 and a non-transitory, computer-readable storage medium 1604. Computer-readable storage medium 1604, amongst other things, is encoded with, i.e., stores, a set of executable instructions 1606, design layouts 1607, design rule check (DRC) decks 1609 or any intermediate data for executing the set of instructions. Each design layout 1607 includes a graphical representation of an integrated chip, such as for example, a GSII file. Each DRC deck 1609 includes a list of design rules specific to a semiconductor process chosen for fabrication of a design layout 1607. Execution of instructions 1606, design layouts 1607 and DRC decks 1609 by hardware processor 1602 represents (at least in part) an EDA tool which implements a portion or all of, e.g., the methods described herein in accordance with one or more (hereinafter, the noted processes and/or methods).

Processor 1602 is electrically coupled to computer-readable storage medium 1604 via a bus 16016. Processor 1602 is also electrically coupled to an I/O interface 1610 by bus 16016. A network interface 1612 is also electrically connected to processor 1602 via bus 1608. Network interface 1612 is connected to a network 1614, so that processor 1602 and computer-readable storage medium 1604 are capable of connecting to external elements via network 1614. Processor 1602 is configured to execute instructions 1606 encoded in computer-readable storage medium 1604 in order to cause EDA system 1600 to be usable for performing a portion or all of the noted processes and/or methods. In one or more embodiments, processor 1602 is a central processing unit (CPU), a multi-processor, a distributed processing system, an application specific integrated circuit (ASIC), and/or a suitable processing unit.

In one or more embodiments, computer-readable storage medium 1604 is an electronic, magnetic, optical, electromagnetic, infrared, and/or a semiconductor system (or apparatus or device). For example, computer-readable storage medium 1604 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1604 includes a compact disk-read only memory (CD-ROM), a compact disk-read/write (CD-R/W), and/or a digital video disc (DVD).

In one or more embodiments, computer-readable storage medium 1604 stores instructions 1606, design layouts 1607 (e.g., layouts of the integrated circuits 10, 20, 30, 40, 50, 60, 70, 80, 90, 1000, 1100, 1200, 1300, 1400 and/or 1500 with capacitors as discussed previously) and DRC decks 1609 configured to cause EDA system 1600 (where such execution represents (at least in part) the EDA tool) to be usable for performing a portion or all of the noted processes and/or methods. In one or more embodiments, storage medium 1604 also stores information which facilitates performing a portion or all of the noted processes and/or methods.

EDA system 1600 includes I/O interface 1610. I/O interface 1610 is coupled to external circuitry. In one or more embodiments, I/O interface 1610 includes a keyboard, keypad, mouse, trackball, trackpad, touchscreen, and/or cursor direction keys for communicating information and commands to processor 1602.

EDA system 1600 also includes network interface 1612 coupled to processor 1602. Network interface 1612 allows EDA system 1600 to communicate with network 1614, to which one or more other computer systems are connected. Network interface 1612 includes wireless network interfaces such as BLUETOOTH, WIFI, WIMAX, GPRS, or WCDMA; or wired network interfaces such as ETHERNET, USB, or IEEE-1388. In one or more embodiments, a portion or all of noted processes and/or methods, is implemented in two or more EDA systems 1600.

EDA system 1600 is configured to receive information through I/O interface 1610. The information received through I/O interface 1610 includes one or more of instructions, data, design rules, libraries of standard cells, and/or other parameters for processing by processor 1602. The information is transferred to processor 1602 via bus 1608. EDA system 1600 is configured to receive information related to a user interface (UI) 1616 through I/O interface 1610. The information is stored in computer-readable medium 1604 as UI 1616.

Also illustrated in FIG. 21 are fabrication tools associated with the EDA system 1600. For example, a mask house 1630 receives a design layout from the EDA system 1600 by, for example, the network 1614, and the mask house 1630 has a mask fabrication tool 1632 (e.g., a mask writer) for fabricating one or more photomasks (e.g., photomasks used for fabricating e.g., layouts of the integrated circuits 10, 20, 30, 40, 50, 60, 70, 80, 90, 1000, 1100, 1200, 1300, 1400 and/or 1500 with capacitors as discussed above) based on the design layout generated from the EDA system 1600. An IC fabricator ("Fab") 1620 may be connected to the mask house 1630 and the EDA system 1600 by, for example, the network 1614. Fab 1620 includes an IC fabrication tool 1622 for fabricating IC chips (e.g., layouts of the integrated circuits 10, 20, 30, 40, 50, 60, 70, 80, 90, 1000, 1100, 1200, 1300, 1400 and/or 1500 with capacitors as discussed above) using the photomasks fabricated by the mask house 1630. By way of example and not limitation, the IC fabrication tool 1622 includes one or more cluster tools for fabricating IC chips. The cluster tool may be a multiple reaction chamber type composite equipment which includes a polyhedral transfer chamber with a wafer handling robot inserted at the center thereof, a plurality of process chambers (e.g., CVD chamber, PVD chamber, etching chamber, annealing chamber or the like) positioned at each wall face of the polyhedral transfer chamber; and a loadlock chamber installed at a different wall face of the transfer chamber.

Figure 22:
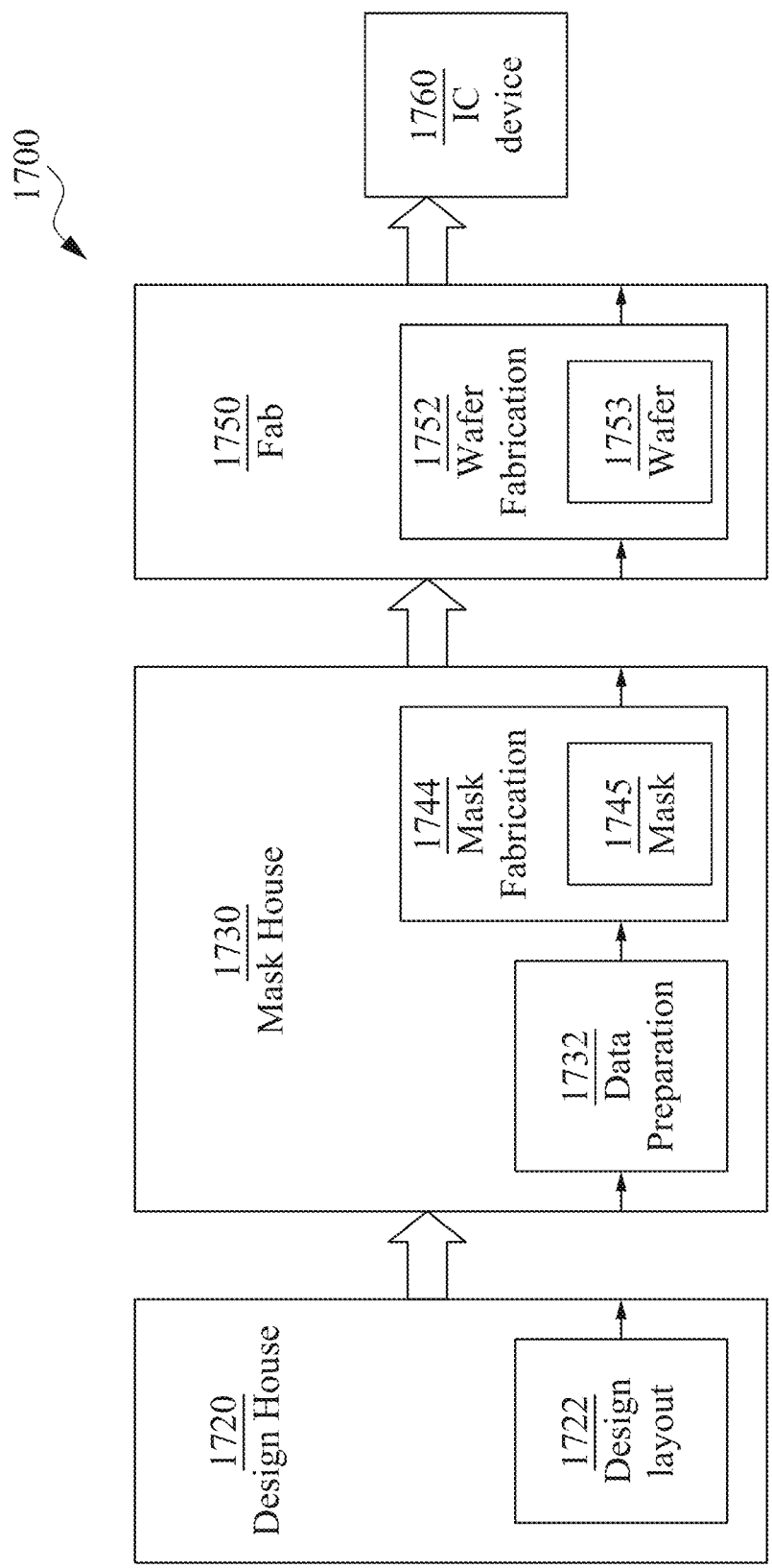
FIG. 22 is a block diagram of an IC manufacturing system and an IC manufacturing flow associated therewith, in accordance with some embodiments of the present disclosure.

FIG. 22 is a block diagram of an IC manufacturing system 1700, and an IC manufacturing flow associated therewith, in accordance with some embodiments. In some embodiments, based on one or more design layouts, e.g., layouts of the integrated circuits 10, 20, 30, 40, 50, 60, 70, 80, 90, 1000, 1100, 1200, 1300, 1400 and/or 1500 with capacitors as discussed above, one or more photomasks and one or more integrated circuits are fabricated using manufacturing system 1700.

In FIG. 22, an IC manufacturing system 1700 includes entities, such as a design house 1720, a mask house 1730, and a Fab 1750, that interact with one another in the design, development, and manufacturing cycles and/or services related to manufacturing ICs 1760. The entities in IC manufacturing system 1700 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1720, mask house 1730, and Fab 1750 is owned by a single larger company. In some embodiments, two or more of design house 1720, mask house 1730, and Fab 1750 coexist in a common facility and use common resources.

Design house (or design team) 1720 generates design layouts 1722 (e.g., layouts of the integrated circuits 10, 20, 30, 40, 50, 60, 70, 80, 90, 1000, 1100, 1200, 1300, 1400 and/or 1500 with capacitors as discussed above). Design layouts 1722 include various geometrical patterns designed for ICs 1760 (e.g., integrated circuits 10, 20, 30, 40, 50, 60, 70, 80, 90, 1000, 1100, 1200, 1300, 1400 and/or 1500 with capacitors as discussed above). The geometrical patterns correspond to patterns of metal, oxide, or semiconductor layers that make up the various components of ICs 1760 to be fabricated. The various layers combine to form various device features. For example, a portion of design layout 1722 includes various circuit features, such as active regions, passive regions, functional gate structures, dummy gate structures, gate contacts, dummy gate contacts, source/drain contacts, and/or metal lines, to be formed on a semiconductor wafer. Design house 1720 implements a proper design procedure to form design layout 1722. The design procedure includes one or more of logic design, physical design or place and route. Design layout 1722 is presented in one or more data files having information of the geometrical patterns and a netlist of various nets. For example, design layout 1722 can be expressed in a GDSII file format or DFII file format.

Mask house 1730 includes data preparation 1732 and mask fabrication 1744. Mask house 1730 uses design layout 1722 (e.g., layout of the integrated circuit 10, 20, 30, 40, 50, 60, 70, 80, 90, 1000, 1100, 1200, 1300, 1400 or 1500 as discussed above) to manufacture one or more photomasks 1745 to be used for fabricating the various layers of IC 1760 according to design layout 1722. Mask house 1730 performs mask data preparation 1732, where design layout 1722 is translated into a representative data file ("RDF"). Mask data preparation 1732 provides the RDF to mask fabrication 1744. Mask fabrication 1744 includes a mask writer. A mask writer converts the RDF to an image on a substrate, such as a photomask (reticle) 1745. Design layout 1722 is manipulated by mask data preparation 1732 to comply with particular characteristics of the mask writer and/or rules of fab 1750. In FIG. 22, mask data preparation 1732 and mask fabrication 1744 are illustrated as separate elements. In some embodiments, mask data preparation 1732 and mask fabrication 1744 can be collectively referred to as mask data preparation.

In some embodiments, mask data preparation 1732 includes optical proximity correction (OPC) which uses lithography enhancement techniques to compensate for image errors, such as those that can arise from diffraction, interference, other process effects and the like. OPC adjusts design layout 1722. In some embodiments, mask data preparation 1732 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1732 includes a mask rule checker (MRC) that checks design layout 1722 that has undergone processes in OPC with a set of mask creation rules which contain certain geometric and/or connectivity restrictions to ensure sufficient margins, to account for variability in semiconductor manufacturing processes, and the like. In some embodiments, the MRC modifies design layout diagram 1722 to compensate for limitations during mask fabrication 1744, which may undo part of the modifications performed by OPC in order to meet mask creation rules.

In some embodiments, mask data preparation 1732 includes lithography process checking (LPC) that simulates processing that will be implemented by Fab 1750 to fabricate ICs 1760. LPC simulates this processing based on design layout 1722 to create a simulated manufactured integrated circuit, such as IC 1760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine design layout 1722.

After mask data preparation 1732 and during mask fabrication 1744, a photomask 1745 or a group of photomasks 1745 are fabricated based on the design layout 1722. In some embodiments, mask fabrication 1744 includes performing one or more lithographic exposures based on the design layout 1722. In some embodiments, an electron-beam (e-beam) or a mechanism of multiple e-beams is used to form a pattern on a photomask 1745 based on design layout 1722. Photomask 1745 can be formed in various technologies. In some embodiments, photomask 1745 is formed using binary technology. In some embodiments, a mask pattern includes opaque regions and transparent regions. A radiation beam, such as an ultraviolet (UV) beam, used to expose the radiation sensitive material layer (e.g., photoresist) which has been coated on a wafer, is blocked by the opaque regions and transmits through the transparent regions. In one example, a binary mask version of photomask 1745 includes a transparent substrate (e.g., fused quartz) and an opaque material (e.g., chromium) coated in the opaque regions of the binary mask. In another example, photomask 1745 is formed using a phase shift technology. In a phase shift mask (PSM) version of photomask 1745, various features in the pattern formed on the phase shift photomask are configured to have proper phase difference to enhance the resolution and imaging quality. In various examples, the phase shift photomask can be attenuated PSM or alternating PSM. The photomask(s) generated by mask fabrication 1744 is used in a variety of processes. For example, such a mask(s) is used in an ion implantation process to form various doped regions in semiconductor wafer 1753, in an etching process to form various etching regions in semiconductor wafer 1753, and/or in other suitable processes.

Fab 1750 includes wafer fabrication 1752. Fab 1750 is an IC fabrication business that includes one or more manufacturing facilities for the fabrication of a variety of different IC products. In some embodiments, Fab 1750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (BEOL fabrication), and a third manufacturing facility may provide other services for the foundry business.

Fab 1750 uses photomask(s) 1745 fabricated by mask house 1730 to fabricate ICs 1760. Thus, fab 1750 at least indirectly uses design layout(s) 1722 (e.g., layouts of the integrated circuits 10, 20, 30, 40, 50, 60, 70, 80, 90, 1000, 1100, 1200, 1300, 1400 and/or 1500 with capacitors as discussed above) to fabricate ICs 1760. In some embodiments, wafer 1753 is processed by fab 1750 using photomask(s) 1745 to form ICs 1760. In some embodiments, the device fabrication includes performing one or more photolithographic exposures based at least indirectly on design layout 1722.

Based on the above discussions, it can be seen that the present disclosure offers advantages. It is understood, however, that other embodiments may offer additional advantages, and not all advantages are necessarily disclosed herein, and that no particular advantage is required for all embodiments.

The capacitor of the present disclosure includes a plurality of conductive stacks. These conductive stacks are arranged in parallel over the STI region and separated from each other by a dielectric medium, which in turn allows for capacitance existing in any adjacent two of the conductive stacks. In greater detail, any adjacent two of the conductive stacks that are arranged in parallel and electrically isolated from each other forms a capacitor. In the present disclosure, each conductive stack of the capacitor includes a dummy gate structure extending along a top surface of the STI region, a plurality of dummy gate contact landing on the dummy gate structures, a plurality of metal lines extending above the dummy gate contacts, and a plurality of metal vias connected between the metal lines. Hence, one advantage of the present disclosure is that the capacitance of the capacitor of the present disclosure includes at least the dummy gate-to-dummy gate capacitance, metal line-to-metal line capacitance, via-to-via capacitance, and contact-to-contact capacitance. Therefore, capacitance of the capacitor resulting from the parallel conducive stacks of the present disclosure can be increased.

Another advantage of the present disclosure is that the dummy gate structures and the dummy gate contacts of the capacitor on a passive region are simultaneously formed with the metal gate structures and the gate contacts on an active region, and thus the dummy gate structures and the dummy gate contacts of the capacitor can be formed without using additional processes and hence additional cost.

In some embodiments, an integrated circuit (IC) structure includes a semiconductor substrate, a shallow trench isolation (STI) region, and a capacitor. The STI region is embedded in the semiconductor substrate. The capacitor includes first and second conductive stacks. The first conductive stack includes a first dummy gate strip disposed entirely within the STI region and a plurality of first metal dummy gate contacts landing on the first metal capacitor strip. The second conductive stack includes a second dummy gate strip disposed entirely within the STI region and extending in parallel with the first dummy gate strip, and a plurality of second dummy gate contacts landing on the second dummy gate strip, wherein the first conductive stack is electrically isolated from the second conductive stack.

In some embodiments, an integrated circuit (IC) structure includes a semiconductor substrate, a shallow trench isolation (STI) structure, a capacitor, and a plurality of metal gate strips. The STI structure is embedded in the semiconductor substrate to define an active region in the semiconductor substrate. The capacitor includes a plurality of conductive stacks extending upwardly from the STI structure and arranged in a first row, in which each of the plurality of conductive stacks includes a dummy gate strip extending along a top surface of the STI structure. The metal gate strips are arranged in a second row over the active region, in which the dummy gate strips having a same material composition as the plurality of metal gate strips of the plurality of conductive stacks.

In some embodiments, a method includes forming a shallow trench isolation (STI) region in a semiconductor substrate to define an active region in the semiconductor substrate; forming a first sacrificial gate structure within the active region and a second sacrificial gate structures within the STI region; replacing the first sacrificial gate structure with a metal gate structure and the second sacrificial gate structure with a dummy gate structure; forming an interlayer dielectric (ILD) layer over the metal gate structure and the dummy gate structure; etching the ILD layer to form contact openings in the ILD layer, wherein the contact openings expose one region of the metal gate structure but a plurality of regions of the dummy gate structure; and depositing a metal material into the contact openings to form a gate contact over the metal gate structure and a plurality of dummy gate contacts over the dummy gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a shallow trench isolation (STI) in a semiconductor substrate to define an active region in the semiconductor substrate;
    forming a first sacrificial gate structure within the active region and a second sacrificial gate structures above the STI;
    replacing the first sacrificial gate structure with a metal gate structure and the second sacrificial gate structure with a first dummy gate structure;
    forming an interlayer dielectric (ILD) layer over the metal gate structure and the first dummy gate structure;
    etching the ILD layer to form contact openings in the ILD layer, wherein the contact openings expose one region of the metal gate structure but a plurality of regions of the first dummy gate structure; and depositing a metal material into the contact openings to form a gate contact over the metal gate structure and a plurality of first dummy gate contacts over the first dummy gate structure.

2. The method of claim 1, further comprising:
forming a first metal line over and extending past the plurality of first dummy gate contacts in a lengthwise direction of the first dummy gate structure.

3. The method of claim 2, further comprising:
forming a plurality of metal vias landing on the first metal line.

4. The method of claim 3, further comprising:
forming a second metal line over and extending past the plurality of metal vias in the lengthwise direction of the first dummy gate structure.

5. The method of claim 1, further comprising:
forming a spacer on a sidewall of the first dummy gate structure.

6. The method of claim 5, further comprising:
forming a contact etch stop layer over the spacer and the STI.

7. The method of claim 1, further comprising:
performing an ion implantation process on the STI.

8. The method of claim 1, further comprising:
forming a second dummy gate structure above the STI and extending in a direction in parallel with a lengthwise direction of the first dummy gate structure.

9. The method of claim 8, further comprising:
forming a plurality of second dummy gate contacts over the second dummy gate structure.

10. The method of claim 1, wherein the first dummy gate structure comprises a high-k dielectric layer on the STI and a metal layer over the high-k dielectric layer.

11. A method, comprising:
forming a shallow trench isolation (STI) structure in a semiconductor substrate and defining an active region on the semiconductor substrate;
forming a plurality of metal gate strips on the active region;
forming a single gate contact for each of the metal gate strips;
forming a source/drain regions interleaving with the metal gate strips from a top view; and
forming a capacitor entirely above the STI structure, the capacitor comprising:
a first conductive stack comprising a first dummy gate strip and a plurality of first dummy gate contacts landing on the first dummy gate strip; and
a second conductive stack comprising a second dummy gate strip extending in parallel with the first dummy gate strip, and a plurality of second dummy gate contacts landing on the second dummy gate strip, wherein the first conductive stack is electrically isolated from the second conductive stack.

12. The method of claim 11, further comprising:
forming a spacer laterally surrounding each of the first and second dummy gate strips and the metal gate strips.

13. The method of claim 12, further comprising:
forming a liner extending along a top surface of the STI structure and a sidewall of each spacer.

14. The method of claim 11, wherein each of the first dummy gate strip, the second dummy gate strip, and the metal gate strips comprises a high-k dielectric layer and a metal structure over the high-k dielectric layer.

15. The method of claim 11, wherein the capacitor further comprises:
a first metal line extending above and in parallel with the first dummy gate strip, and
a second metal line extending above and in parallel with the second dummy gate strip at a same level height as the first metal line.

16. A method, comprising:
forming a dielectric material in a semiconductor substrate and defining an active region on the semiconductor substrate;
forming a metal gate structure on the active region and first and second dummy gate structures on the dielectric material;
forming a plurality of source/drain region in the active region and on opposite sides of the metal gate structure;
forming a single gate contact over the metal gate structure and a plurality of first dummy gate contacts over the first dummy gate structure, and a plurality of second dummy gate contacts over the second dummy gate structure; and
forming a first metal line extending above and in parallel with the first dummy gate structure and a second metal line extending above and in parallel with the second dummy gate structure.

17. The method of claim 16, further comprising:
forming a plurality of first metal vias landing on the first metal line, and a plurality of second metal vias landing on the second metal line.

18. The method of claim 17, further comprising:
forming a third metal line over and extending past the plurality of first metal vias in a lengthwise direction of the first dummy gate structure, and forming a fourth metal line over and extending past the plurality of second metal vias in a lengthwise direction of the second dummy gate structure.

19. The method of claim 16, wherein one of the plurality of first dummy gate contacts is aligned with one of the plurality of second dummy gate contacts in a direction perpendicular to a lengthwise direction of the first dummy gate structure.

20. The method of claim 16, wherein the first dummy gate structure is spaced apart from the second dummy gate structure.

* * * * *